(12) United States Patent
Caiafa et al.

(10) Patent No.: US 10,637,461 B2
(45) Date of Patent: Apr. 28, 2020

(54) GATE DRIVE DEVICES AND SWITCHING SYSTEMS

(71) Applicant: General Electric Company, Schenectady, NY (US)

(72) Inventors: Antonio Caiafa, Schenectady, NY (US); Dominique Poincloux, Paris (FR); Marcos Garcia Arregui, Paris (FR)

(73) Assignee: General Elelctric Company, Schenectady, NY (US)

( * ) Notice: Subject to any disclaimer, the term of this patent is extended or adjusted under 35 U.S.C. 154(b) by 72 days.

(21) Appl. No.: 16/121,216

(22) Filed: Sep. 4, 2018

(65) Prior Publication Data

US 2019/0181857 A1 Jun. 13, 2019

Related U.S. Application Data

(63) Continuation-in-part of application No. 14/211,894, filed on Mar. 14, 2014, now abandoned.

(51) Int. Cl.
| | |
|---|---|
| *H05G 1/58* | (2006.01) |
| *H03K 17/16* | (2006.01) |
| *H03K 17/30* | (2006.01) |
| *H03K 17/691* | (2006.01) |
| *H03K 17/61* | (2006.01) |
| *H03K 3/57* | (2006.01) |

(52) U.S. Cl.
CPC ......... *H03K 17/168* (2013.01); *H03K 17/302* (2013.01); *H03K 17/61* (2013.01); *H03K 17/691* (2013.01); *H05G 1/58* (2013.01); *H03K 3/57* (2013.01)

(58) Field of Classification Search
None
See application file for complete search history.

(56) References Cited

U.S. PATENT DOCUMENTS

| | | |
|---|---|---|
| 4,887,199 A | 12/1989 | Whittle |
| 5,369,564 A | 11/1994 | Choi |
| 6,178,055 B1 | 1/2001 | Janz |
| 6,542,022 B2 | 4/2003 | Gonthier et al. |
| 7,301,250 B2 | 11/2007 | Cassel |
| 7,414,333 B2 | 8/2008 | Hatano et al. |
| 8,493,018 B2 * | 7/2013 | Kroeze ................ H02M 7/538 318/254.1 |
| 8,829,949 B2 | 9/2014 | Zajc |
| 2010/0039170 A1 | 2/2010 | Ryoo |
| 2012/0155614 A1 * | 6/2012 | Caiafa ..................... H03K 3/53 378/111 |
| 2012/0194119 A1 * | 8/2012 | Kroeze ................ H02M 7/538 318/503 |

(Continued)

*Primary Examiner* — Thomas R Artman

(57) ABSTRACT

A gate drive circuit device includes positive and negative pulse circuit portions each including a pulse diode and a pulse assembly connected in parallel with each other. The pulse assemblies each include another pulse diode and a resistor-capacitor assembly connected in series. The resistor-capacitor assembly includes a pulse resistor and a pulse capacitor connected in parallel. Each pulse circuit portion is connected with a different switch. Each pulse circuit portion is a passive device that is configured to activate a different switch responsive to receiving one or more voltage pulses from a power supply.

23 Claims, 24 Drawing Sheets

(56) References Cited

U.S. PATENT DOCUMENTS

| | | | |
|---|---|---|---|
| 2013/0181748 A1* | 7/2013 | Zajc | H03K 19/017 |
| | | | 327/109 |
| 2014/0063593 A1 | 3/2014 | Berendt | |
| 2014/0167724 A1 | 6/2014 | Deng et al. | |
| 2017/0171954 A1* | 6/2017 | Caiafa | H01J 35/08 |
| 2019/0181857 A1* | 6/2019 | Caiafa | H03K 17/168 |

* cited by examiner

GATE DRIVE DEVICES AND SWITCHING SYSTEMS

CROSS-REFERENCE TO RELATED APPLICATIONS

This application is a continuation-in-part of U.S. patent application Ser. No. 14/211,894, which was filed on 14 Mar. 2014, and the entire disclosure of which is incorporated herein by reference.

BACKGROUND

Electrical devices (e.g., x-ray tubes for computed tomography (CT) x-ray imaging systems) may use active switches to control the switching of the power source or supply for the devices (e.g., power source or supply for the x-ray tubes). For example, active switches are typically controlled by driving circuits using lower voltage signals, which may be implemented without much complexity when the switches are electrically referenced to ground. As the switches are electrically referenced to higher and higher voltages, however, more complex and bulky driving circuits are needed to allow the switches to turn on and off independent of each other. In these systems, particularly when the switches are referenced to different higher voltages, the control of the multiple switches includes switching equipment that is more complex and bulky (e.g., a large amount of fiber optics for communicating control signals, and large power supplies to send power to gate drivers at multiple isolated voltage references), adding size, complexity and cost to the overall system.

Known systems for controlling voltage switching, such as for controlling the voltage switching to an x-ray tube (e.g., fast kV switching for dual x-ray systems), may include isolated gate drives. These drives control the voltage switching to control the energy of the electron beam generated by the x-ray source, such as by controlling the voltage to the electron emission source and target of the x-ray tube. For example, CT imaging systems may comprise energy-discriminating (ED), multi-energy (ME), and/or dual-energy (DECT) imaging systems that may be referred to as an EDCT, MECT, and/or DECT imaging system. The EDCT, MECT, and/or DECT imaging systems are configured to measure energy-sensitive projection data. The energy-sensitive projection data may be acquired using multiple applied x-ray spectra by modifying the operating voltage of the x-ray tube or utilizing x-ray beam filtering techniques (e.g., energy-sensitive x-ray generation techniques), or by energy-sensitive data acquisition by the detector using energy-discriminating, or with photon counting detectors or dual-layered detectors (e.g., energy-sensitive x-ray detection techniques).

For example, with x-ray generation techniques, various system configurations utilize modification of the operating voltage of the x-ray tube including: (1) acquisition of different energy (e.g., low-energy and high-energy) projection data from two sequential scans of the object using different operating voltages of the x-ray tube, (2) acquisition of projection data utilizing rapid or fast switching of the operating voltage of the x-ray tube to acquire low-energy and high-energy information for an alternating subset of projection views, or (3) concurrent acquisition of energy-sensitive information using multiple imaging systems with different operating voltages of the x-ray tube.

The known drive controls for these systems may be referenced to multiple different high voltages (e.g., voltages more than ten kilovolts or a greater amount). When referenced to the high voltages, however, the conventional hardware to control the switching is physically large, thereby adding size, weight, and/or cost to the system. In some systems, the lack of space in the overall system may prevent implementation of these drive controls.

Additionally, known drive controls that are referenced to high voltages may require longer periods of time to dissipate any stored energy following the opening of switches or deactivation of loads controlled by the drive controls. This can limit how quickly the loads can operate and/or deactivate.

BRIEF DESCRIPTION

In one embodiment, a gate drive circuit device is provided that includes a positive pulse circuit portion including a first positive pulse diode and a positive pulse assembly connected in parallel with each other. The positive pulse assembly includes a second positive pulse diode and a first resistor-capacitor assembly connected in series. The first resistor-capacitor assembly includes a positive pulse resistor and a positive pulse capacitor connected in parallel with each other. The positive pulse circuit portion also is configured to be conductively coupled with a first switch. The gate drive circuit device also includes a negative pulse circuit portion having a first negative pulse diode and a negative pulse assembly connected in parallel with each other. The negative pulse assembly includes a second negative pulse diode and a second resistor-capacitor assembly connected in series. The second resistor-capacitor assembly includes a negative pulse resistor and a negative pulse capacitor connected in parallel with each other. The negative pulse circuit portion also is configured to be conductively coupled with a second switch. The positive pulse circuit portion is configured to activate the first switch responsive to receiving one or more positive voltage pulses from a power supply. The negative pulse circuit portion is configured to activate the second switch responsive to receiving one or more negative voltage pulses from the power supply.

In one embodiment, a switching system includes two or more of the gate drive circuit devices and two or more sets of the first and second switches. Each of the sets of the first and second switches is coupled with a different gate drive circuit device of the gate drive circuit devices. The switching system also includes two or more sets of opposing diodes, with each of the sets of the opposing diodes connected with a different set of the sets of the first and second switches. The switching system also includes auxiliary inductors each conductively coupled with different set of the opposing diodes, auxiliary capacitors each conductively coupled with different set of the opposing diodes and the auxiliary inductors, output capacitors each conductively coupled with different set of the opposing diodes, and voltage sources each conductively coupled with different set of the opposing diodes and with a different output capacitor of the output capacitors. The voltage sources also are configured to be coupled with a load.

In one embodiment, a switching system includes two or more of the gate drive circuit devices and the transformer device having the primary winding, at least one transformer core, and the secondary winding of each of the gate drive circuit devices. The transformer device is configured to concurrently transfer one or more of the positive voltage pulse and the negative voltage pulse to the secondary windings of all the gate drive circuit devices.

DETAILED DESCRIPTION

Figure 1:
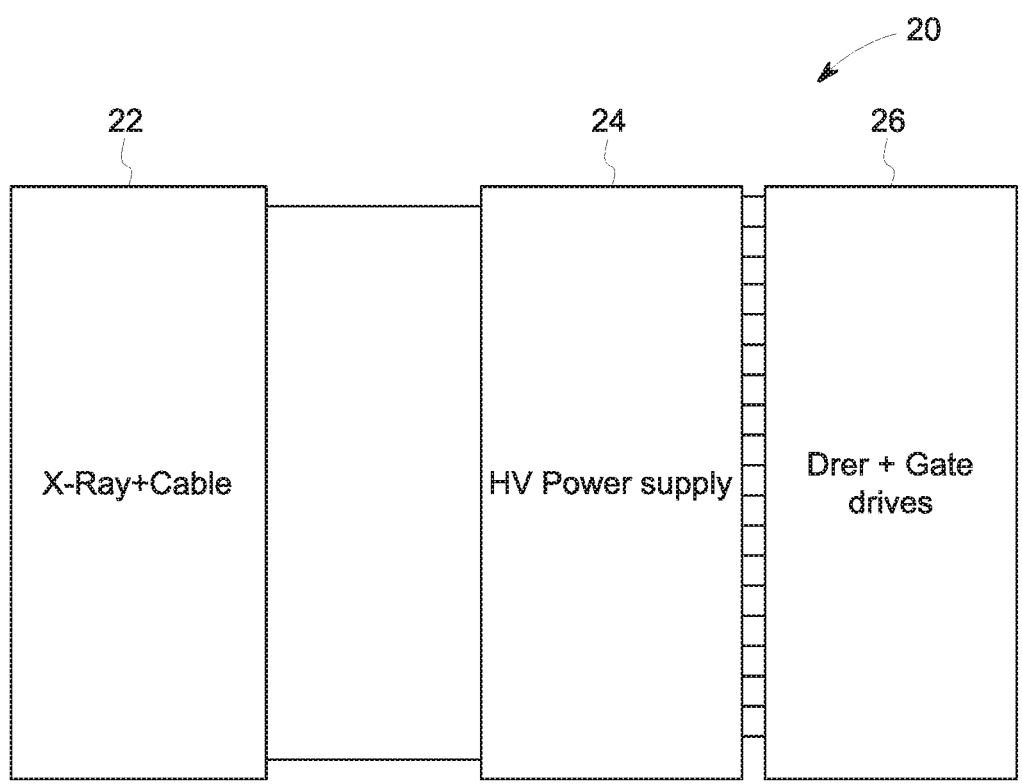
FIG. 1 is a simplified block diagram of a power system in accordance with various embodiments.

The following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Although the various embodiments may be described herein within a particular operating environment, for example a particular imaging system, such as a "third generation" computed tomography (CT) system (e.g., a sixty-four-slice CT system), it should be appreciated that one or more embodiments are equally applicable for use with other configurations and systems, such as for different types of medical and baggage scanning systems. For example, various embodiments are applicable to x-ray radiographic imaging systems as well as x-ray tomosynthesis imaging systems. Additionally, embodiments will be described with respect to the detection and conversion of x-rays. However, it also should be appreciated that embodiments are equally applicable for the detection and conversion of other high frequency electromagnetic energy. Also, although the x-ray tube and detector may be described to rotate around the object being imaged, alternate configurations wherein the detector and x-ray source are held stationary and the object is rotated are also contemplated, such as is used for industrial non-destructive testing purposes. Hence, although discussed in the context of CT systems, the various embodiments may be applied to projection x-ray imaging used in other medical and industrial radiographic applications as well.

Various embodiments provide systems and methods for controlling voltage switching, which may include a gate drive circuit device for controlling multiple devices floating at multiple voltages. For example, some embodiments provide control of switches simultaneously or concurrently when the switches are referenced to high voltages (e.g., 10 kV-300 kV), including when referenced to multiple high voltages (e.g., ten multiple, different high voltages from 10 kV to 100 kV in steps of 10 kV). By practicing one or more embodiments, control of switches for voltages applied or referenced to multiple devices may be simplified, including having controls with less components and being less complex. For example, various embodiments may be used for super-fast kV switching applications, such as for use in dual x-ray systems. By practicing one or more various embodiments, fast switching between a first voltage level and a second voltage level (e.g., high and low voltage levels) may be achieved, enabling improved separation in the mean energy of applied x-ray spectra, thereby improving material decomposition and effective atomic number estimation of a scanned object.

Figure 2:
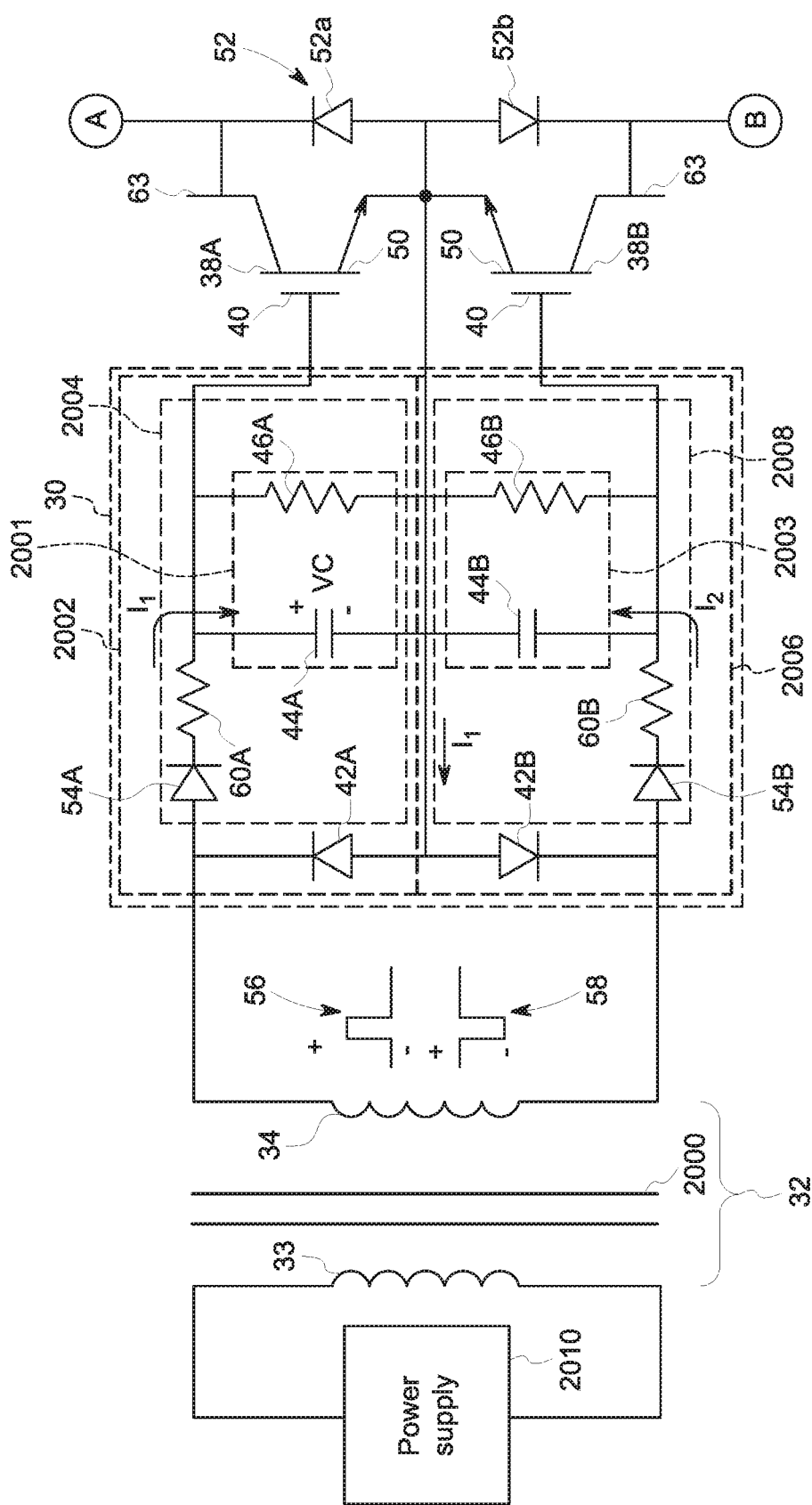
FIG. 2 illustrates a passive drive arrangement or gate drive circuit device in accordance with various embodiments.
Figure 6:
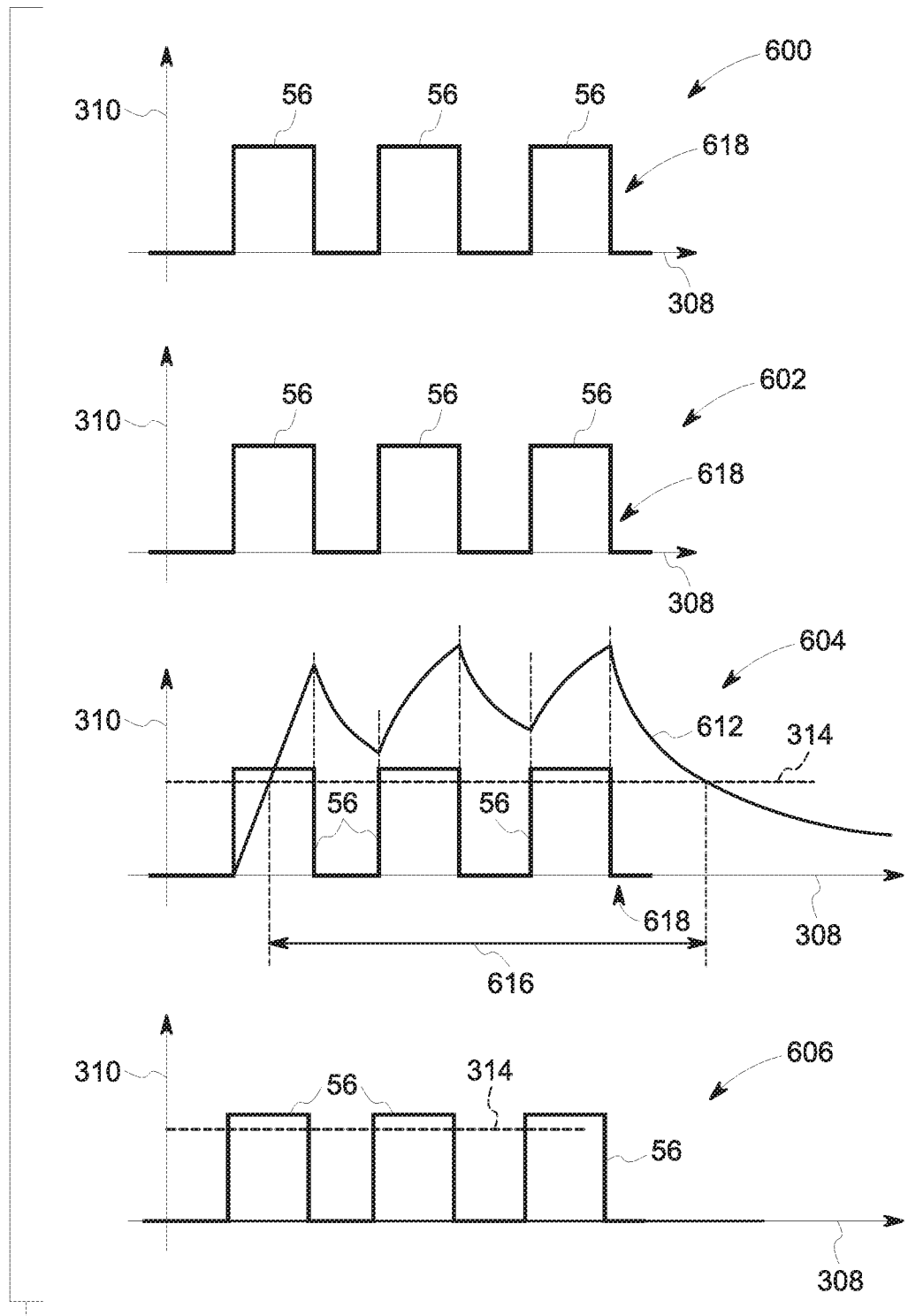
FIG. 6 illustrates additional examples of timing diagrams and associated voltage pulses used to control operation of the gate drive circuit device shown in FIG. 2.

By practicing one or more embodiments, for example as shown in FIG. 2, a plurality of switches (e.g., two switches) may be independently controlled with a single transformer winding or multiple transformer windings. By practicing one or more embodiments, for example as shown in FIG. 6, drive power may be provided, as well as control signals, with a single transformer. Thus, in various embodiments, one or more controls or functions may be performed using a single component, such as a single transformer or transformer winding. Accordingly, a reduced number of transformers or other control devices may be used in various embodiments. Additionally, a reduced cost or size of the transformers may be provided in some embodiments. For example, in high voltage circuits, the cost and size of the transformers is primarily due to the high voltage insulation used, which can be reduced by practicing one or more embodiments.

Figure 10:
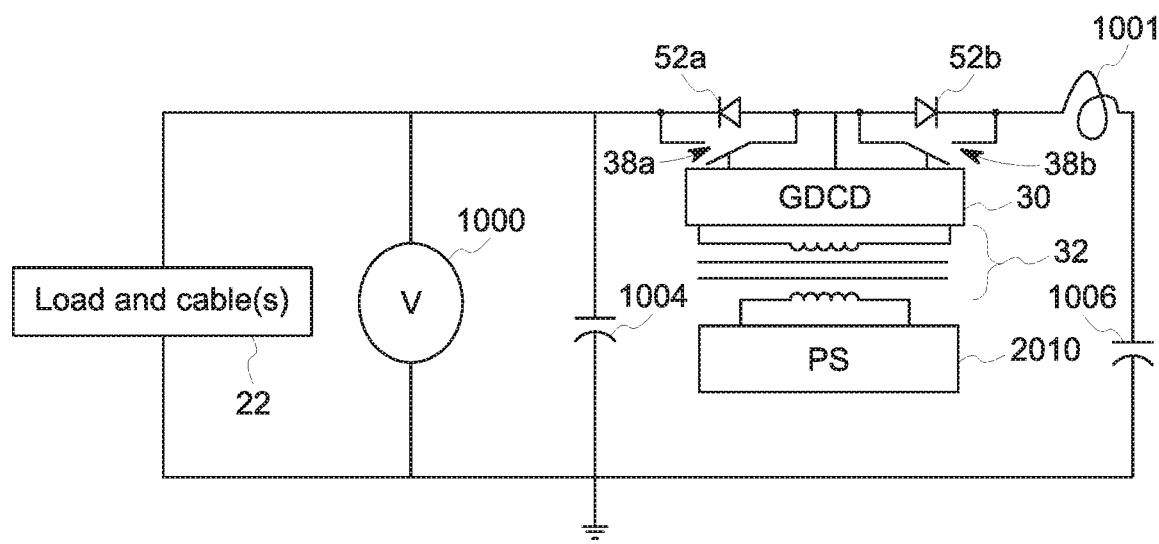
FIG. 10 illustrates one example of application of the gate drive circuit device shown in FIG. 2.
Figure 13:
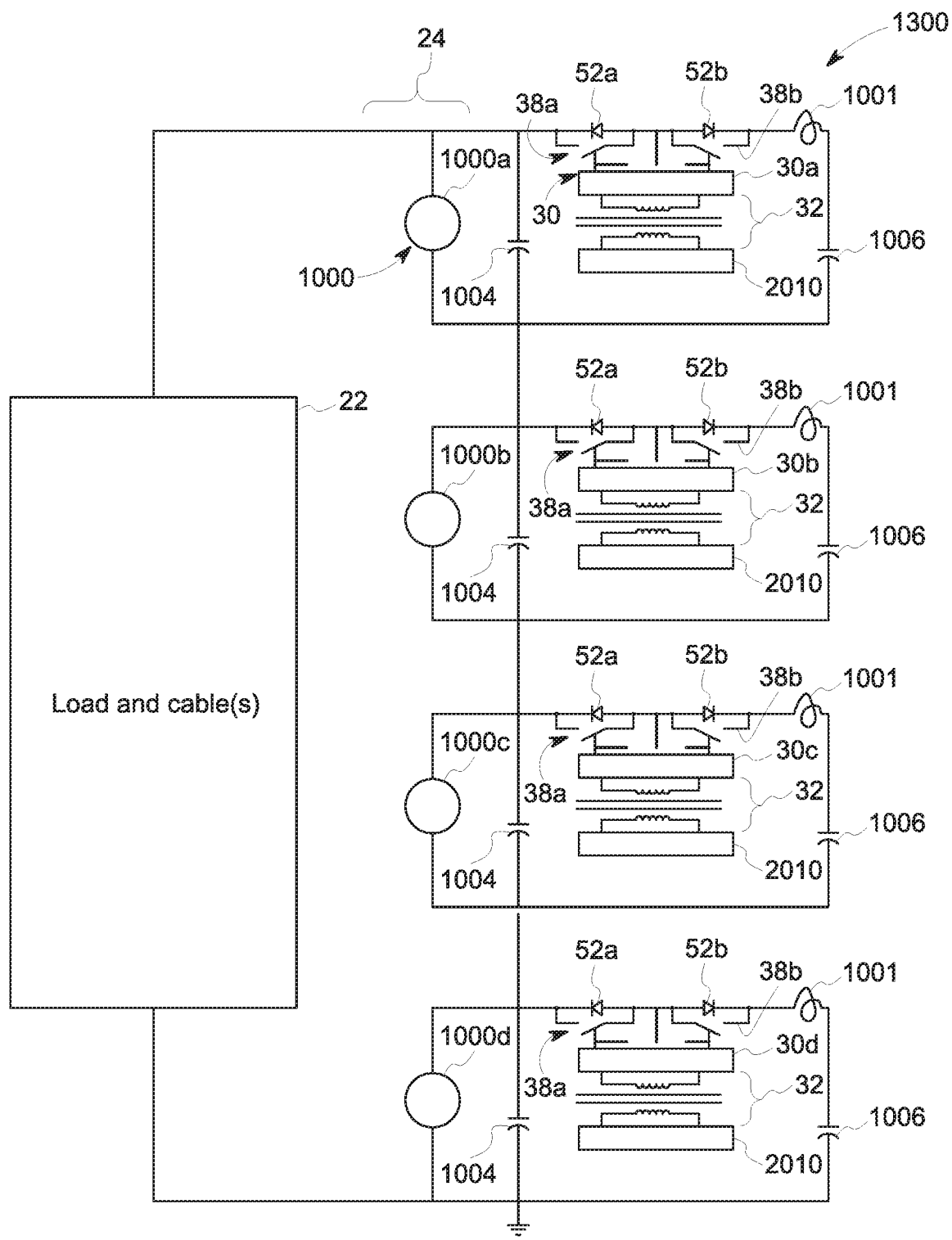
FIG. 13 illustrates one embodiment of a switching system.

Various embodiments may be implemented in systems where the voltage to be switched is very large (e.g., 200 kV or greater), the parasitic capacitances to ground are also very large, or the energy required by the load is relatively small, as is the case for industrial inspection systems utilizing stationary anode x-ray tube technology. In various embodiments, power or voltage switching of multiple devices or components referenced to different high voltages is provided. For example, as shown in FIG. 1 illustrating a power system 20, an electrical system 22 ("X-ray+cable" in FIG. 1, also referred to as a load 22) can be powered or referenced to multiple voltages provided by a power source 24 ("HV Power supply" in FIG. 1). The electrical system 22 optionally can be referred to herein as a load. The power source 24 is shown as a high voltage (HV) power supply and the electrical system 22 is shown as an x-ray imaging system (and associated cable(s)) in FIG. 1. Alternatively, the power source 24 may be another supply of voltage and/or the electrical system 22 may be another system that is powered by voltage from the power source 24. In the illustrated embodiment, the electrical system 22 can be referenced to many different voltages, as shown by the multiple connections between the power source 24 and several gate drive circuit devices 30 (plus switches and inductances and capacitors as illustrated in FIGS. 10 and 13) in a switching system 26 ("DRER+Gate Drives" in FIG. 1). The electrical system 22 can be referenced to multiple different high voltages (voltages such as 10 kV, 20 kV, 30 kV, and so on).

In various embodiments, different gate drive circuit devices 30 may be provided for controlling the switching of the different referenced voltages. For example, passive and/or active switching drive arrangements may be provided. FIG. 2 illustrates a passive drive arrangement or gate drive circuit device 30 in accordance with various embodiments. In this embodiment, the gate drive circuit device 30 is powered by the received signal itself as described in more detail herein.

The gate drive circuit device 30 may be used to control switching of power from a transformer device 32 having a primary winding 33 and a secondary winding 34 separated from each other by a core 2000. The gate drive circuit device 30 controls the supply of power to a pair of switching devices 38, illustrated as Insulated Gate Bipolar Transistor (IGBT). It should be appreciated, however, that different switching devices may be used, for example metal-oxide-semiconductor field-effect transistors (MOSFETs), or different types of transistors. Additionally, the switching devices may be formed using silicon (Si), Silicon Carbide (SiC), Gallium Nitride (GaN) or any other material suitable to build controllable solid-state devices. In various embodiments, the gate drive circuit device 30 individually controls conduction of drive signals to gates 40 of the switching devices 38.

The gate drive circuit 30 includes different portions of circuitry that are conductively coupled with each other. A positive pulse circuit portion 2002 of the gate drive circuit 30 includes a positive pulse diode 42a and a positive pulse assembly 2004 conductively connected in parallel with each other. The positive pulse assembly 2004 includes another positive pulse diode 54a, in series with a positive circuit portion 2001 formed of a capacitor 44a and a resistor 46a that are connected in parallel with each other in a capacitor-resistor assembly. Optionally, the positive assembly 2004 includes a limiting resistor 60a.

The gate drive circuit 30 also includes a negative pulse circuit portion 2006 having a negative pulse diode 42b and a negative pulse assembly 2008 conductively connected in parallel with each other. The negative pulse assembly 2008 includes another negative pulse diode 54b, in series with a negative circuit portion 2003 formed of a capacitor 44b and a resistor 46b that are connected in parallel with each other in another capacitor-resistor assembly. Optionally, the negative pulse circuit portion 2006 includes a limiting resistor 60b.

The positive and negative pulse circuit portions 2002, 2006 are connected in series with each other and in parallel across the secondary winding 34 of the transformer device 32. The circuit portions 2002, 2006 are connected across the gates 40 and source terminals 50 of each of the switching devices 38. Optionally, if the switching devices 38 are or include IGBTs, the circuit portions 2002, 2006 can be connected across the gates 40 and emitter terminals of each IGBT. A pair of diodes 52 (e.g., diodes 52a, 52b) also could be connected between the source terminal 50 and drain terminal 63 of each of the switching devices 38. Optionally, if the switching devices 38 are or include IGBTs, the pair of diodes 52 (e.g., diodes 52a, 52b) also could be connected between the emitter terminal 50 and collector terminal 63 of each IGBT. As described below, the gate drive circuit device 30 can be connected with a power supply circuit that couples a voltage (or current) source with one or more loads. This power supply circuit can connect with the gate drive circuit device 30 at locations labeled A and B in FIG. 2.

In operation, a power supply 2010 can be conductively coupled with the primary winding 33 of the transformer device 32. The power supply 2010 can represent a connection with an electric utility grid, one or more batteries, one or more inverters, or one or more other devices through which electric current is conducted to the primary winding 33. This power supply 2010 is different from the power source 24 shown in FIG. 1. For example, the power supply 2010 can provide voltages that control operation of the switching devices 38, while the power source 24 provides current to power the electrical system 22 shown in FIG. 1. In one embodiment, the power supply 2010 is or includes a voltage tank having switches to control the generation of positive and/or negative pulse voltages as described herein. The power supply 2010 can conduct or control the conduction of a positive pulse voltage signal 56 into the primary winding 33 of the transformer 32. The power supply 2010 provides the signals to turn on the devices 38A and/or 38B, as well as provides the power required to execute the "turn on" command.

Figure 3:
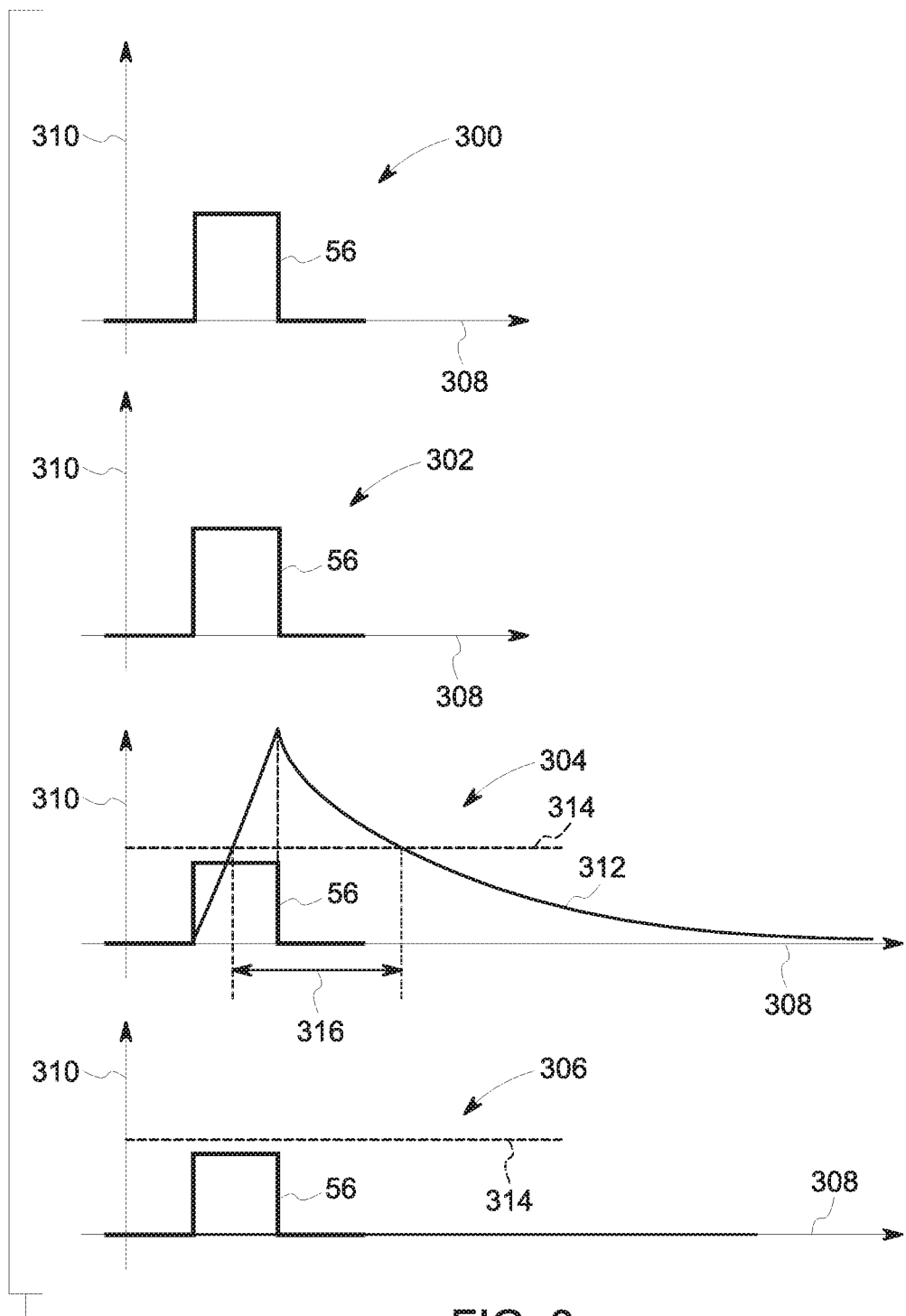
FIG. 3 illustrates one example of timing diagrams and associated voltage pulses used to control operation of the gate drive circuit device shown in FIG. 2.

FIG. 3 illustrates one example of timing diagrams 300, 302, 304, 306 that are representative of operation of the gate drive circuit device 30 to turn the switching device 38a on while keeping the switching device 38b off. Each of the timing diagrams 300, 302, 304, 306 is shown alongside a horizontal axis 308 representative of time and a vertical axis 310 representative of voltage.

The timing diagram 300 represents the timing of application of the positive voltage reference pulse 56. The positive pulse 56 is produced on one side (e.g., the primary coil or winding 33) of the transformer 32 (as shown in the diagram 300), and the pulse 56 in the diagram 302 can be replicated on the other side (e.g., the secondary coil or winding 34) of the transformer 32. While the pulses 56 in the diagrams 300, 302 are shown as having the same magnitude, optionally, the pulse 56 on the coil 34 may have a larger or smaller magnitude as the pulse 56 on the coil 33. The reference pulse 56 in diagrams 304 and 306 is provided only for reference, and the pulse 56 is not applied to and does not appear on the capacitor 44A or 44B, or the gate drive device 30

The positive voltage reference pulse 56 on the coil 34 generates a current $I_1$ that is conducted through the diodes 54a and 42b (and the resistor 60a if provided). This current $I_1$ charges the capacitor 44a in the positive circuit portion 2004 to a voltage (Vc). This current $I_1$ is blocked from charging the capacitor 44b in the negative circuit portion 2008 by the diode 42b.

The timing diagram 304 represents the voltage 312 applied to the gate 40 of the switching device 38a (also referred to as a drive current or signal), while the timing diagram 306 represents the voltage applied to the gate 40 of the other switching device 38b. As described above, the pulse 56 on the coil 34 is shown in the diagrams 304, 306 merely for illustration of the timing of the pulse 56 and the voltage 312. The pulse 56 is not applied to and does not appear on the switching device 38a or 38b. The charging of the capacitor 44a creates a drive current or signal 312 that is conducted or otherwise applied to the gate 40 of the switching device 38a. If this drive current signal 312 has a voltage that exceeds a turn-on voltage threshold 314 of the switching device 38a, then conduction of the positive voltage reference pulse 56 turns on the switching device 38a (e.g., closes the switching device 38a) by way of the drive signal 312 (thereby allowing current flow through the switching device 38a). The switching device 38b may have the same or different turn-on or threshold voltage 314. But, due to the capacitor 44b in the negative circuit portion 2008 not being charged by the positive voltage reference pulse 56, no drive signal is created that is conducted to the gate 40 of the switching device 38b, as shown in the timing diagram 306. As a result, the switching device 38b remains open or turned off.

The single positive reference pulse 56 can generate a drive signal 312 that increases above and remains above the turn-on voltage 314 for an active period 316 of time. The drive signal 312 created by the single positive reference pulse 56 eventually decreases below the turn-on voltage 314, which causes the switching device 38a to turn off or open (and no longer conduct electric current through the switching device 38a). The switching device 38a may be maintained in an on state by sending a train of pulses 56 (shown in FIG. 6 and described herein) to maintain the charge of the capacitor 44a. Once a single reference pulse 56 or train of pulses 56 is stopped, the capacitor 44a discharges through the resistor 46a, which may be referred to as a discharged state. As the capacitor 44a discharges and the voltage of the drive signal (e.g., the charge of the capacitor 44a) falls below the threshold voltage 314 of the gate 40, the switching device 38a turns off, thereby blocking current flow through the switching device 38a.

Figure 4:
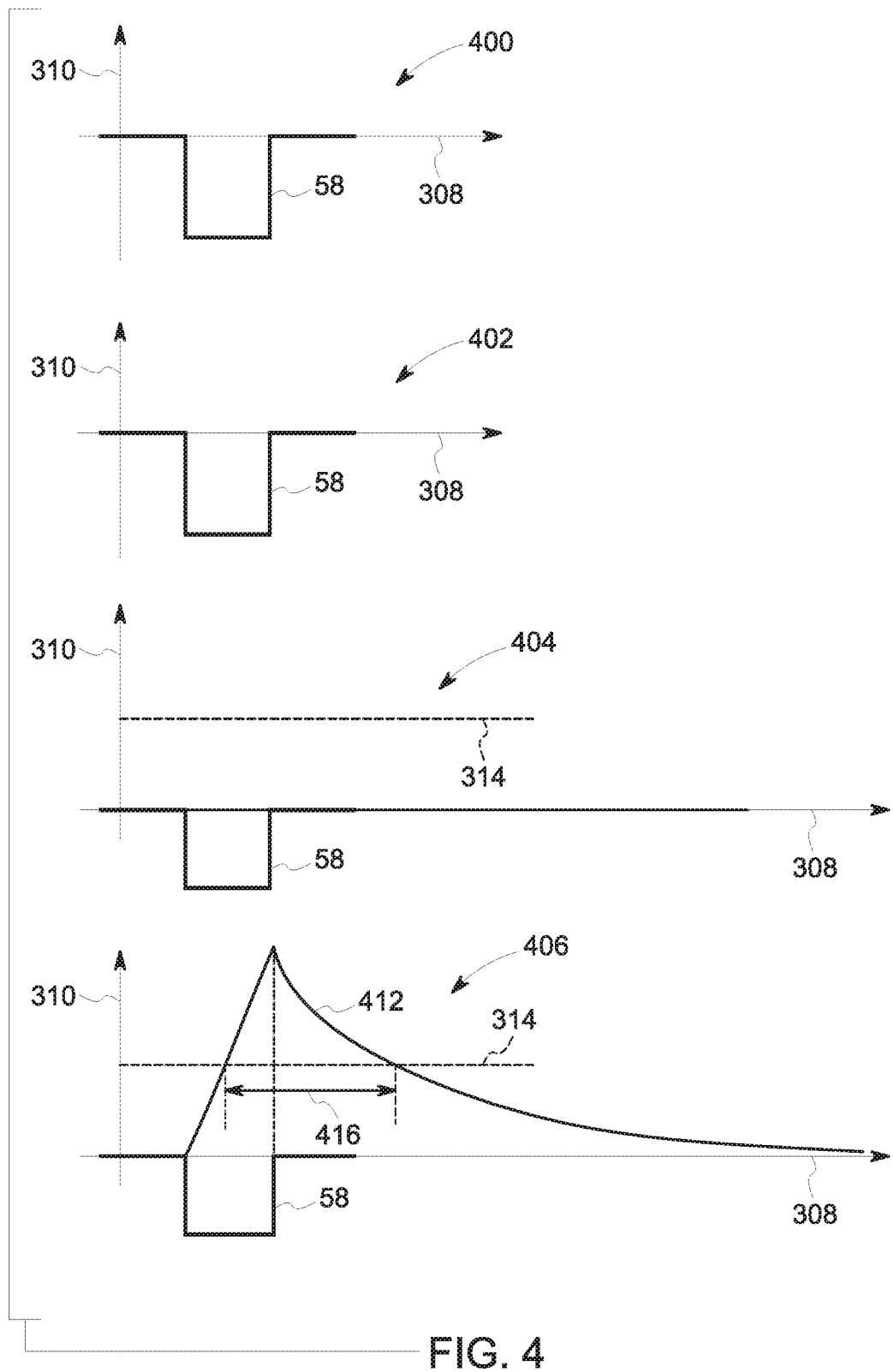
FIG. 4 illustrates other examples of timing diagrams and associated voltage pulses used to control operation of the gate drive circuit device shown in FIG. 2.

FIG. 4 illustrates timing diagrams 400, 402, 404, 406 that are representative of one example of operation of the gate drive circuit device 30 to turn the switching device 38b on while keeping the switching device 38a off. Each of the timing diagrams 400, 402, 404, 406 is shown alongside the horizontal axis 308 and vertical axis 310 described above. The timing diagram 400 represents application of a negative voltage reference pulse 58 to the coil 33 of the transformer 32, while the timing diagram 402 represents replication of this same pulse 58 (or a different magnitude negative pulse 58) on the coil 34 of the transformer 32. Similar to as described above in connection with the pulse 56, the pulse 58 is not applied to and does not appear on the capacitor 44B or the gate drive device 30, but is shown in the diagrams 404, 406 merely to illustrate the timing of the pulse 58 and the current or signal 412 described below. The negative voltage reference pulse 58 generates a current $I_2$ that is conducted through the diodes 54b and 42a (and the resistor 60b if provided). This current $I_2$ charges the capacitor 44b in the negative circuit portion 2008 to the voltage (Vc) or to another voltage. This current $I_2$ is blocked from charging the capacitor 44a in the positive circuit portion 2004 by the diode 42a.

The timing diagram 404 represents the current or voltage conducted to the gate 40 of the switching device 38a, while the timing diagram 406 represents the current or voltage conducted to the gate 40 of the other switching device 38b. The charging of the capacitor 44b creates a drive signal 412 that is conducted or otherwise applied to the gate 40 of the switching device 38b. If this drive signal 412 has a voltage that exceeds the turn-on voltage threshold 314 of the switching device 38b, then conduction of the negative voltage reference pulse 58 turns on the switching device 38b (e.g., closes the switching device 38b) by way of the drive signal 412 (thereby allowing current flow through the switching device 38b). Due to the capacitor 44a in the positive circuit portion 2004 not being charged by the negative voltage reference pulse 58, no drive signal is created that is conducted to the gate 40 of the switching device 38a, as shown in the timing diagram 404. As a result, the switching device 38a remains open or turned off.

The single negative reference pulse 58 can generate a drive signal 412 that increases above and remains above the turn-on threshold voltage 314 for an active period 416 of time. The drive signal 412 created by the single negative reference pulse 58 eventually decreases below the turn-on voltage 314, which causes the switching device 38b to turn off or open (and no longer conduct electric current through the switching device 38b). The switching device 38b may be maintained in an on state by sending a train of pulses 58 (shown and described herein) to maintain the charge of the capacitor 44b. Once a single reference pulse 58 or train of pulses 58 is stopped, the capacitor 44b discharges through the resistor 46b, which may be referred to as a discharged state. As the capacitor 44b discharges and the voltage of the drive signal (e.g., the charge of the capacitor 44b) falls below the threshold voltage 314 of the gate 40, the switching device 38b turns off, thereby blocking current flow through the switching device 38b.

Figure 5:
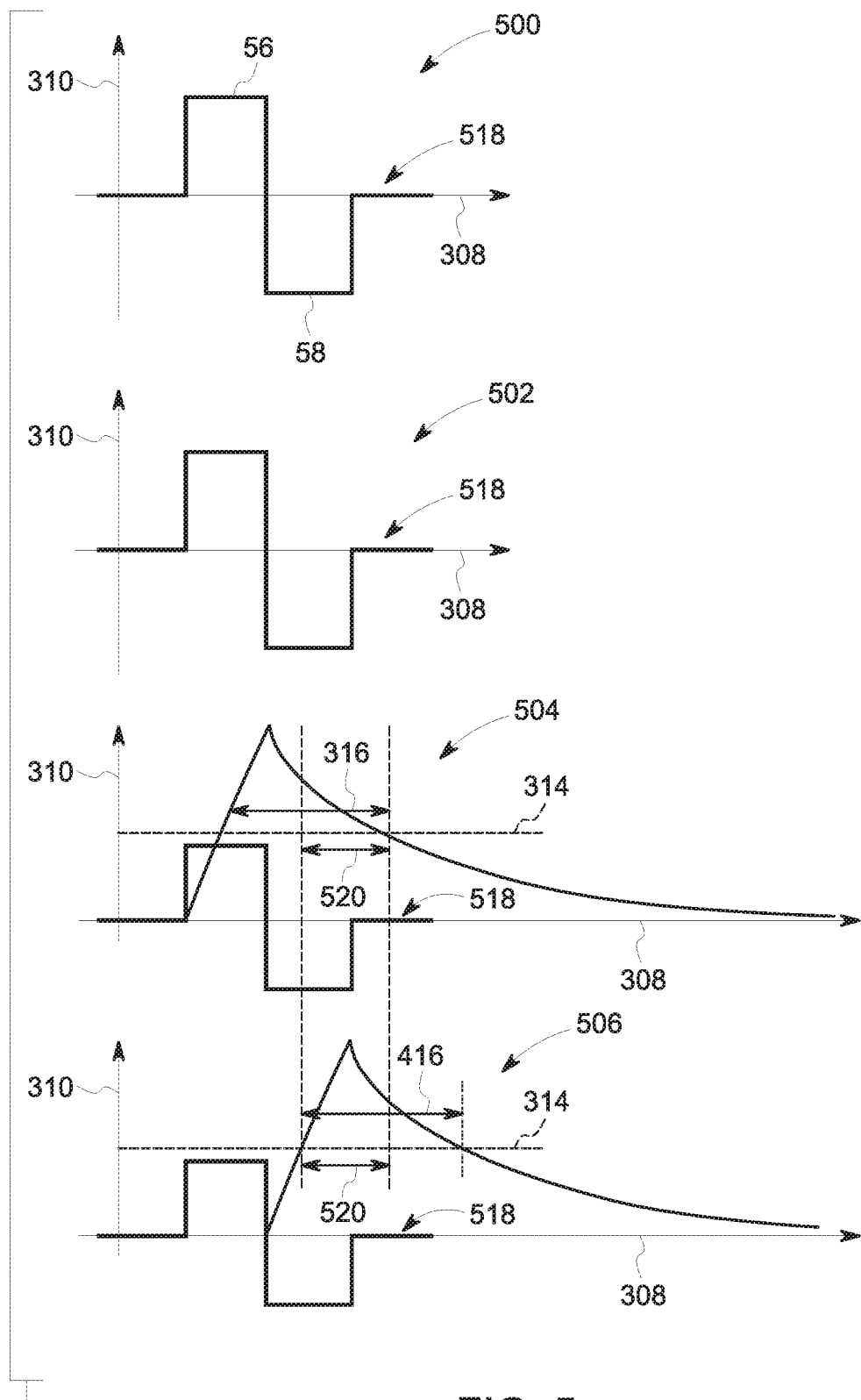
FIG. 5 illustrates other examples of timing diagrams and associated voltage pulses used to control operation of the gate drive circuit device shown in FIG. 2.

FIG. 5 illustrates timing diagrams 500, 502, 504, 506 that are representative of another example of operation of the gate drive circuit device 30 to turn both switching devices 38a, 38b on. Each of the timing diagrams 500, 502, 504, 506 is shown alongside the axes 308, 310 described above. The timing diagram 500 represents application a combined pulse train 518 to the coil 33 of the transformer 32, and the timing diagram 502 represents replication of this same (or different magnitude) pulse train 518 on the coil 34 of the transformer 32. Similar to as described above, the pulse train 518 is shown in the diagrams 504, 506 to illustrate timing of the pulse train 518, and the pulse train 518 is not applied to and does not appear on the capacitors 44A, 44B or the gate drive device 30.

The pulse train 518 includes a sequence of series of multiple pulses 56 and/or 58. The pulse train 518 shown in FIG. 5 is formed from a positive reference pulse 56 that transitions into and/or is immediately followed by a negative reference pulse 58. Alternatively, the pulse train 518 can include the negative reference pulse 58 followed by the positive reference pulse 56. Optionally, the pulse train 518 can include multiple positive and/or negative pulses 56, 58.

As described above, the positive reference pulse 56 generates the current $I_1$, which charges the capacitor 44a to form the drive signal 312 that turns on or closes the switching device 38a (e.g., timing diagram 504), and the negative reference pulse 58 generates the current $I_2$, which charges the capacitor 44b to form the drive signal 412 that turns on or closes the switching device 38b (e.g., timing diagram 506). As shown in the timing diagrams 504, 506, the pulse train 518 causes both switching devices 38a, 38b to be activated (e.g., closed) during a common time period 520, with the switching device 38a being activated or closed during the earlier time period 316 and the switching device 38b being activated or closed during the later time period 416.

FIG. 6 illustrates timing diagrams 600, 602, 604, 606 that are representative of another example of operation of the gate drive circuit device 30 to turn the switching device 38a on for a longer period of time 616 while the switching device 38b remains off. Each of the timing diagrams 600, 602, 604, 606 is shown alongside the axes 308, 310 described above. The timing diagram 600 represents application of a positive pulse train 618 (formed from multiple positive voltage pulses 56 separated in time with respect to each other) to the coil 33 of the transformer 32, and the timing diagram 602 represents replication of this same (or different magnitude) pulse train 618 on the coil 34 of the transformer 32. Similar to as described above, the pulse train 618 is shown in the diagrams 604, 606 to illustrate timing of the pulse train 618, and the pulse train 618 is not applied to and does not appear on the capacitors 44A, 44B or the gate drive device 30.

Each of the positive pulses 56 in the pulse train 618 generates the current $I_1$, which charges the capacitor 44a to form the drive signal 612. Each subsequent positive reference pulse 56 increases the voltage in the drive signal 612 as shown in the timing diagram 604. This keeps the drive signal 612 above the threshold voltage 314 for longer (e.g., longer than a single or fewer positive pulses 56). As a result, the switching device 38a remains closed or active for a longer period of time 616 relative to a pulse train or drive signal 612 having fewer positive pulses 56 and/or having positive pulses 56 that are separated in time by greater amounts. For example, if the positive pulses 56 are separated in time too much from each other, the drive signal 612 may decrease below the threshold 314 before the subsequent positive reference pulse 56 is received. This can allow the switching device 38a to open or turn off before the subsequent positive reference pulse 56 is received. Because the pulse train 618 does not include any negative pulses 58, the capacitor 44b is not charged and the switching device 38b is not closed or activated.

Figure 7:
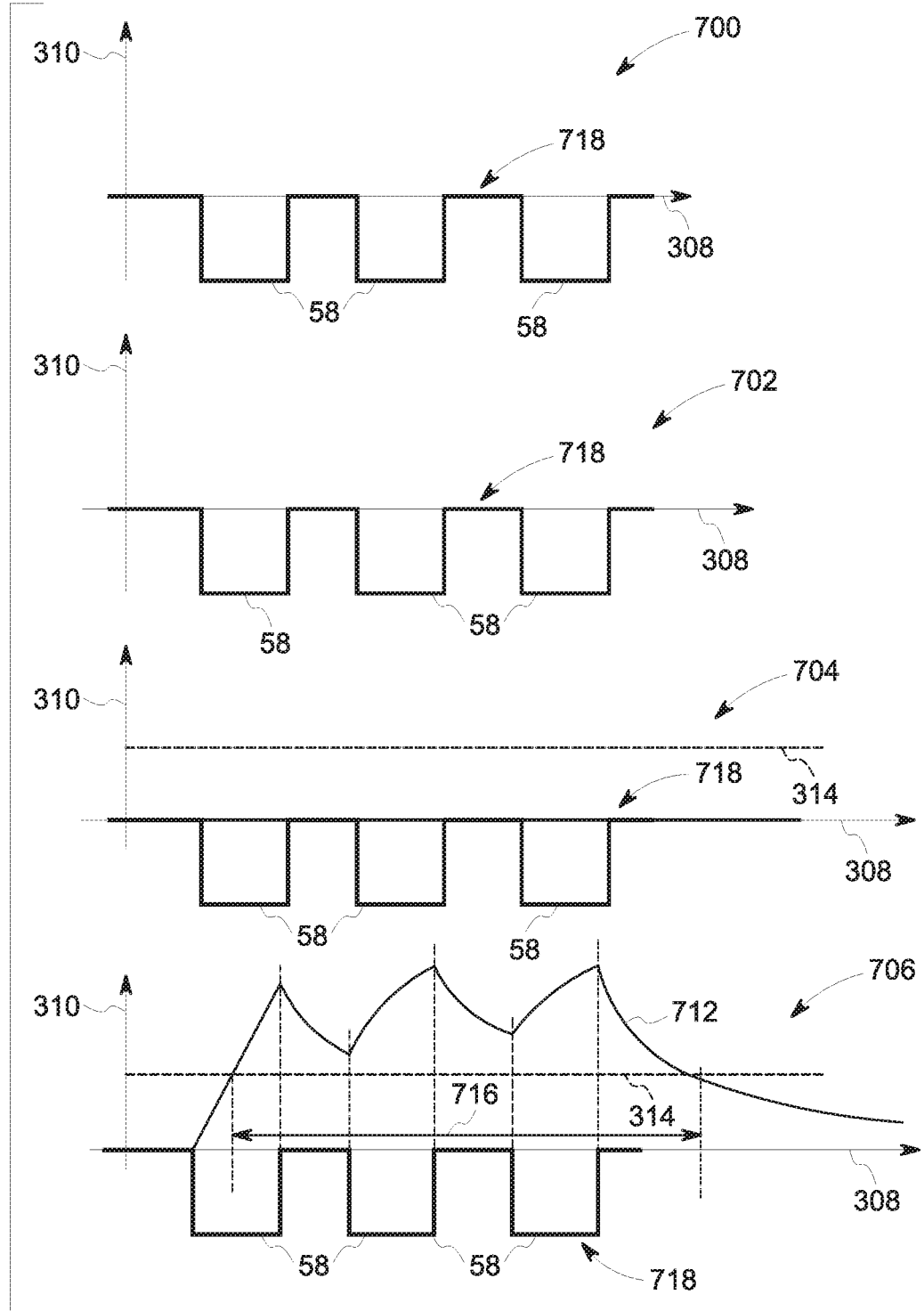
FIG. 7 illustrates examples of timing diagrams and associated voltage pulses used to control operation of the gate drive circuit device shown in FIG. 2.

FIG. 7 illustrates timing diagrams 700, 702, 704, 706 that are representative of another example of operation of the gate drive circuit device 30 to turn the switching device 38b on for a longer period of time 716 while the switching device 38a remains off. Each of the timing diagrams 700, 702, 704, 706 is shown alongside the axes 308, 310 described above.

The timing diagram 700 represents application of a negative pulse train 718 (formed from multiple negative voltage pulses 58 separated in time with respect to each other) to the coil 33 of the transformer 32, and the timing diagram 702 represents replication of this same (or different magnitude) pulse train 718 on the coil 34 of the transformer 32. Similar to as described above, the pulse train 718 is shown in the diagrams 704, 706 to illustrate timing of the pulse train 718, and the pulse train 718 is not applied to and does not appear on the capacitors 44A, 44B or the gate drive device 30.

Each of the negative pulses 58 in the pulse train 718 generates the current $I_2$, which charges the capacitor 44b to form the drive signal 712. Each subsequent negative reference pulse 58 increases the voltage in the drive signal 712 as shown in the timing diagram 706. This keeps the drive signal 712 above the threshold voltage 314 for longer (e.g., longer than a single or fewer negative pulses 58). As a result, the switching device 38b remains closed or active for a longer period of time 716 relative to a pulse train or drive signal 712 having fewer negative pulses 58 and/or having negative pulses 58 that are separated in time by greater amounts. For example, if the negative pulses 58 are separated in time too much from each other, the drive signal 712 may decrease below the threshold 314 before the subsequent negative reference pulse 58 is received. This can allow the switching device 38b to open or turn off before the subsequent negative reference pulse 58 is received. Because the pulse train 718 does not include any positive pulses 56, the capacitor 44a is not charged and the switching device 38a is not closed or activated.

Figure 8:
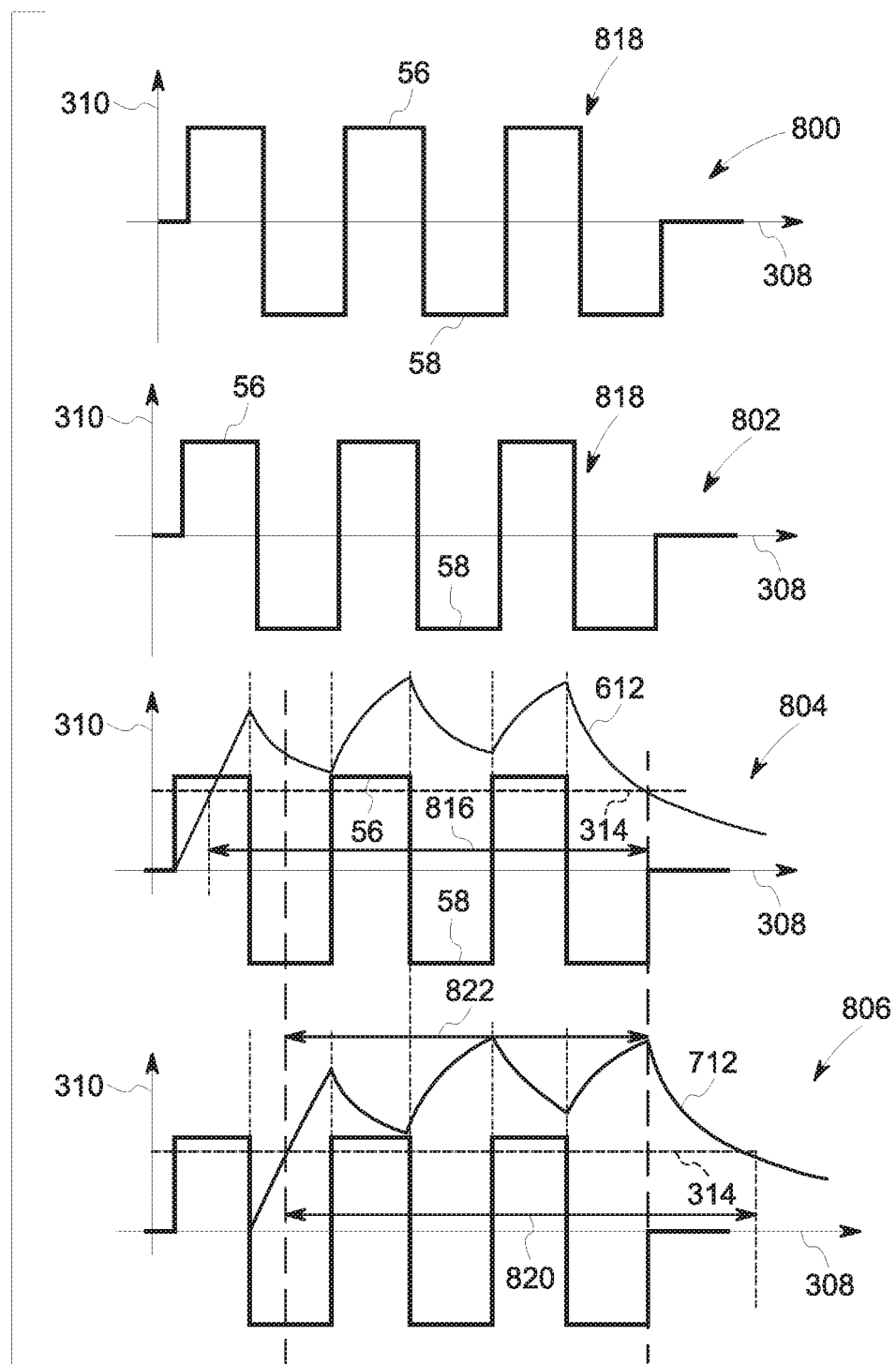
FIG. 8 illustrates additional examples of timing diagrams and associated voltage pulses used to control operation of the gate drive circuit device shown in FIG. 2.

FIG. 8 illustrates timing diagrams 800, 802, 804, 806 that are representative of another example of operation of the gate drive circuit device 30 to turn both the switching devices 38a, 38b on at the same time and for a longer period of time 822. Each of the timing diagrams 800, 802, 804, 806 is shown alongside the axes 308, 310 described above. The timing diagrams 800, 802 represent application of a combined pulse train 818 (formed from multiple positive and negative voltage pulses 56, 58) to the coil 33 of the transformer 32, and the timing diagram 802 represents replication of this same (or different magnitude) pulse train 818 on the coil 34 of the transformer 32. Similar to as described above, the pulse train 818 is shown in the diagrams 804, 806 to illustrate timing of the pulse train 818, and the pulse train 818 is not applied to and does not appear on the capacitors 44A, 44B or the gate drive device 30.

Each of the positive pulses 56 in the pulse train 818 generates the current $I_1$, which charges the capacitor 44a to form the drive signal 612. Each positive reference pulse 56 increases the voltage in the drive signal 612 as shown in the timing diagram 804. This keeps the drive signal 612 above the threshold voltage 314 for longer (e.g., longer than a single or fewer positive pulses 56). As a result, the switching device 38a remains closed or active for a longer period of time 816 relative to a pulse train having fewer positive pulses 56 and/or having positive pulses 56 that are separated in time by greater amounts, as described above.

Each of the negative pulses 58 in the pulse train 818 generates the current $I_2$, which charges the capacitor 44b to form the drive signal 712. Each subsequent negative reference pulse 58 increases the voltage in the drive signal 712 as shown in the timing diagram 806. This keeps the drive signal 712 above the threshold voltage 314 for longer (e.g., longer than a single or fewer negative pulses 58). As a result, the switching device 38b remains closed or active for a longer period of time 820 relative to a pulse train 712 having fewer negative pulses 58 and/or having negative pulses 58 that are separated in time by greater amounts. For example, if the negative pulses 58 are separated in time too much from each other, the drive signal 712 may decrease below the threshold 314 before the subsequent negative reference pulse 58 is received, as described above.

As shown in the timing diagrams 804, 806, the pulse train 818 causes both switching devices 38a, 38b to be activated (e.g., closed) during a common time period 820, with the switching device 38a being activated or closed during the earlier time period 816 and the switching device 38b being activated or closed during the later time period 820.

Figure 9:
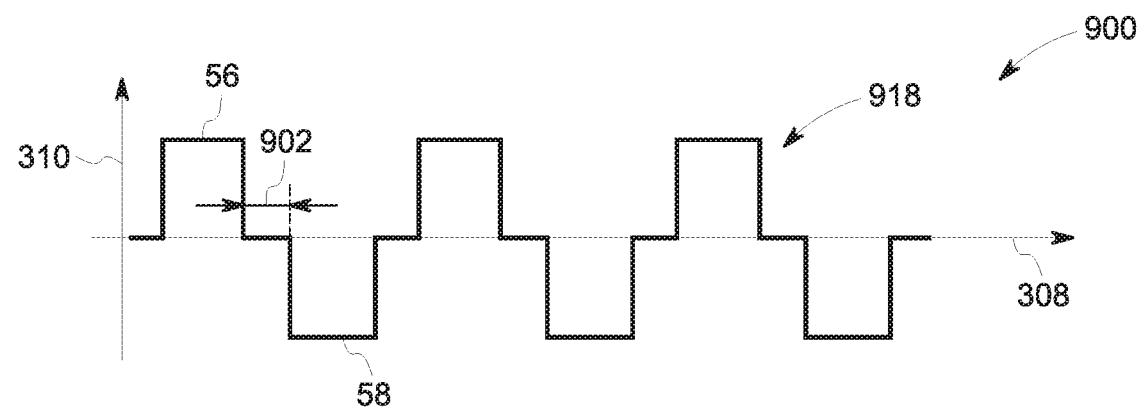
FIG. 9 illustrates another example of a timing diagram and associated voltage pulses used to control operation of the gate drive circuit device shown in FIG. 2.

FIG. 9 illustrates another example of a timing diagram 900. The timing diagram 900 shows another combination pulse train 918. The pulse train 918 is shown alongside the axes 308, 310 described above. The combination pulse train 918 is similar to the pulse train 818, except that the positive and negative pulses 56, 58 in the pulse train 918 are separated in time from each other by a temporal delay 902. This temporal delay 902 can allow for the drive signal applied to the gate 40 of one or both of the switching devices 38a, 38b to decrease toward or below the threshold voltage 314 while the pulse train 918 continues to be supplied to the positive and negative circuit portions 2004, 2008. This may result in one or both switching devices 38a, 38b alternating between turning on and turning off in a sequence.

FIG. 10 illustrates one example of operation of the gate drive circuit device 30. The gate drive circuit device 30 ("GDCD" in FIG. 10) can be coupled with the switching devices 38a, 38b described above, which are conductively coupled with a power or voltage source 1000 and the load 22 (which may include one or more cables). The voltage source 1000 can be a high voltage source as described herein (such as a high voltage power supply) or can be another source of current to power the load 22. The diodes 52a, 52b also are coupled with the voltage source 1000 and the load 22. An output capacitor 1004 and an auxiliary capacitor 1006 also are conductively coupled with the switching devices 38a, 38b, the voltage source 1000, and the load 22. The auxiliary capacitor 1006 optionally can include an inductor 1001, as shown in FIG. 10.

Starting from an operational point in which the voltage source 1000 produces a voltage Va, and the capacitor 1004 and the cable(s) of the load 22 are charged to the same voltage Va, when a second voltage Vb (lower than the voltage Va) is desired, the voltage source 1000 is set to voltage Vb. Because the load 22 is highly capacitive, the voltage on the load 22 and capacitor 1004 change very slowly. To greatly speed up the change and recover the energy in the cable of the load 22 and the capacitance 1004, the power source 2010 ("PS" in FIG. 10) supplies one or more positive pulses 56 to the gate drive circuit device 30 to close the switching device 38a or turn on the switching device 38a, as described above. While the switching device 38a is closed or activated (and the switching device 38b is open or deactivated), current from the load and cable(s) 22 can be conducted in the circuit shown in FIG. 10 through the closed switching device 38a, around the open diode 52a, and through the diode 52b around the open switch 38b and into the auxiliary capacitor 1006. This charges the auxiliary capacitor 1006 and discharges the output capacitor 1004 and the load 22 to the desired voltage Vb. At this stage, the energy is stored in the auxiliary capacitor 1006. When the voltage on the cable 22 and the capacitor 1004 is desired to be equal to Va, the power source 2010 supplies one or more negative pulses 58 to the gate drive circuit device 30 to close the switching device 38b or turn on the switching device 38b, as described above. While the switching device 38b is closed or activated (and the switching device 38a is open or deactivated), current from the auxiliary capacitor 1006 flows through the closed switch 38b and through the diode 52a into the output capacitor 1004 and the cable 22. When the energy is transferred back the voltage source 1000 is set to Va again.

This operation can permit the load 22 to be operated at different voltages quickly, even with a high voltage supplied to the load 22 from the voltage source 1000. For example, during voltage change of the load 22, instead of the energy stored in the output capacitor 1004 being dissipated through resistors and/or inductors, the energy can be quickly transferred to and stored in the auxiliary capacitor 1006. This transfer can occur much more rapidly than dissipation of the high voltage energy. Similarly, during an increase of voltage of the load 22, the energy stored in the auxiliary capacitor 1006 can be quickly transferred to the output capacitor 1004 and/or the load 22.

Figure 11:
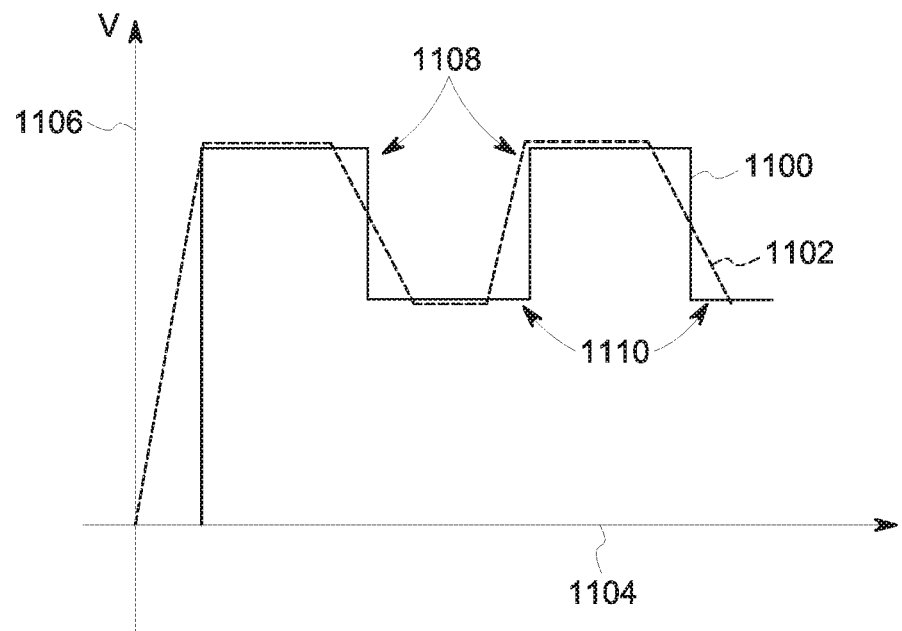
FIG. 11 illustrates a comparison between speeds at which conduction of voltages can be controlled using one or more known electrical systems enabled by one or more known gate drive systems.

FIG. 11 illustrates a comparison between an ideal voltage waveform 1100 and an actual voltage waveform 1102 speed to the cable and load 22. The voltage waveform 1102 can be produced by one or more existing voltage sources circuits. The voltages 1100, 1102 are shown alongside a horizontal axis 1104 representative of time and a vertical axis 1106 representative of the voltage supplied to the load(s). The voltages 1100, 1102 increase and decrease between increased voltages 1108 (Va) and decreased voltages 1110 (Vb). Supplying the increased voltages 1108 to the load cause the load to operate at high energy, while supplying the decreased voltages 1110 cause the load to operate at low energy.

As shown, the ideal or target speed at which the voltage waveform 1100 is supplied to the load (and switched back and forth between the increased and decreased voltages) occurs more rapidly than the actual speed at which the voltage 1102 is supplied to the load by known gate drive circuits. The known gate drive circuits can require additional time to dissipate the high voltages stored in components of the gate drive circuits and/or loads, which can delay the decrease of the voltage 1102 when transitioning from the increased voltage 1108 to the decreased voltage 1110. This can limit how quickly the load can transition between being at high voltage to being at low voltage and/or from being deactivated to being activated. Additionally, at least some known gate drive switching technologies result in a very large, heavy, and unreliable circuitry.

Figure 12:
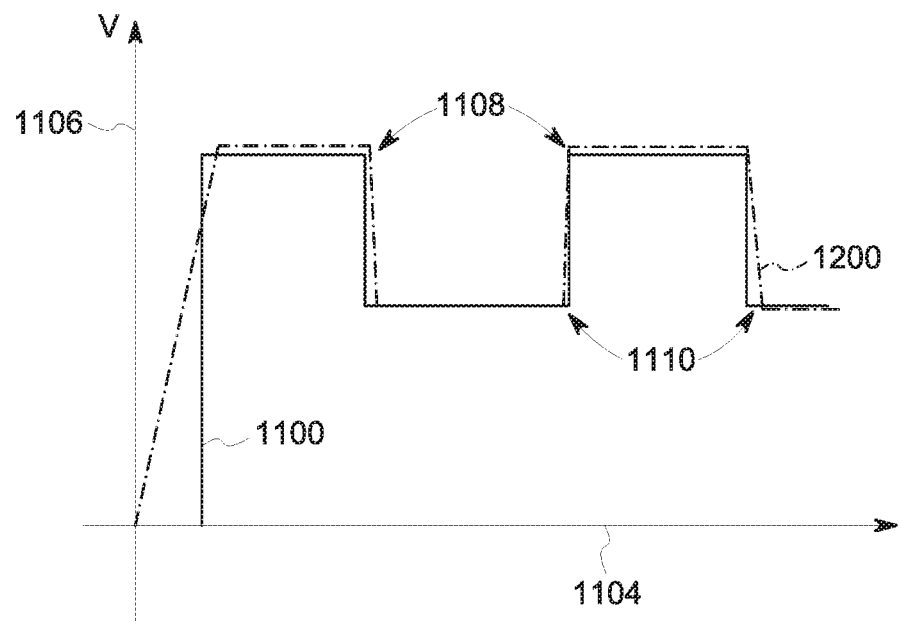
FIG. 12 illustrates a comparison between speeds at which conduction of voltages can be controlled using the electrical system enabled by the gate drive circuit device shown in FIG. 2.

FIG. 12 illustrates a comparison between a speed at which one or more embodiments of the gate drive circuit device 30 described above control the supply of a high voltage 1200 to a load to operate the load at high or low voltage with an ideal or target speed at which the voltage 1102 could be supplied to the load. The voltages 1200, 1100 are shown alongside the axes 1104, 1106 described above. As shown, the system enabled by the gate drive circuit device 30 (e.g., the system 26) can transition between the increased and decreased voltages 1108, 1110 much more rapidly than the known systems represented by 1102 in FIG. 11. This indicates that the system enabled by the gate drive circuit device 30 can transition the voltage on the load much more rapidly than known voltage systems. Additionally, the system enabled by the gate drive circuit device 30 is drastically more compact and reliable than many or all known systems. This can be due at least in part from the ability of the gate drive circuit device 30 to control which switching devices 38a, 38b are activated or deactivated by conduction of a single positive or negative reference pulse 56, 58. Conduction of this single or negative reference pulse 56, 58 can both control which switching device 38a, 38b is to be activated (e.g., close) and power a capacitor 44a, 44b to apply at least the threshold turn on voltage to the switching device 38a, 38b to implement the closing or activation of that switching device 38a, 38b.

FIG. 13 illustrates one embodiment of a switching system 1300. The switching system 1300 can include one or more of the gate drive circuit devices 30 (e.g., devices 30a-d in FIG. 13) to control the supply of different voltages from different voltage sources 1000 (e.g., sources 1000a-d in FIG. 13) to the same load 22. The voltage sources 1000a-d can be seen as part (i.e. subsystems) of a comprehensive single power supply 24. The voltage sources 1000 can be referenced to different high voltages in one embodiment, such as 10 kV for the voltage source 1000a, 20 kV for the voltage source 1000b, 30 kv for the voltage source 1000c, and 40 kV for the voltage source 1000d. Alternatively, one or more of the voltage sources 1000 can be referenced to a greater or lesser voltage, or two or more of the voltage sources 1000 can be referenced to the same voltage.

Each of the gate drive circuit devices 30, along with the devices 38a 38b 52a and 52b, can be separately connected to a different voltage source 1000 to control how much voltage (Va or Vb from each voltage source 1000, although the Va and/or Vb supplied from each source 1000 can be different) is supplied to the load 22. The voltage sources 1000 power the load 22, while the supply or supplies 2010 generate voltage pulses to control the gate drive circuit devices 30. The gate drive circuit devices 30 are shown as being coupled to different transformer devices 32 in FIG. 13, but the different transformer devices 32 can be a single transformer device 32 that controls all the gate drive devices 30, as described below. Even if the reference voltage of one or more of the voltage sources 1000 changes, this change does not influence the control of the switching devices 38a, 38b as the secondary windings 34, and therefore the gate drive circuits 30, are isolated from the voltage sources 1000. For example, the voltage from a source 1000 would be blocked from entering a gate drive circuit device 30 not conductively coupled to the switching device 38a, 38b, by the transformer 32. Thus, the switching devices 38 may be turned on and maintained on without any external or additional power to keep the switching devices 38 on or activated.

In operation, each gate drive circuit device 30 can receive one or more positive and/or negative pulses 56, 58 from one or more power sources 2010 to separately control which switching devices 38a, 38b are activated or deactivated, as described above. This permits the gate drive circuit devices 30 to rapidly switch the conduction of different high voltages from the corresponding voltage source 1000 to the load 22 to rapidly change how much voltage is supplied to the load 22. Also, as described above, the auxiliary capacitors 1006 can store large amounts of energy from the load and/or cables 22. This energy can be rapidly moved from and to the cable and load 22 due to the operation of the gate drive circuit devices 30 that rapidly activate or deactivate the switches 38a and/or 38b.

For example, when the voltages sources 1000 in FIG. 13 are operated independently, the gate drive circuit device 30a can activate the switching device 38b coupled with the gate drive circuit device 30a so that the voltage from the voltage source 1000a to the load and cable 22 can be quickly increased. The other gate drive circuit devices 30b-d can deactivate the other switching devices 38b (or keep the switching devices 38b deactivated) to prevent voltage manipulation from the other sources 1000b-d to the load 22.

The gate drive circuit device 30c can activate the switching device 38b coupled with the gate drive circuit device 30c so that the voltage from the voltage source 1000c can be quickly decreased to the load 22. The other gate drive circuit devices 30b, 30d can deactivate the other switching devices 38b (or keep the switching devices 38b deactivated) to prevent manipulation of the voltages from the other sources 1000b, 1000d to the load 22. Other combinations of the gate drive circuit devices 30a-d can be used to increase or decrease how much voltage is supplied to the load 22. When the circuitry in FIG. 13 is used as a single power supply, as shown in FIG. 1, the gate drives 30 can be controlled with the same voltage pulse signal such that the energies from the auxiliary capacitors 1006 are transferred to and from the cable and the load 22 at the same time.

Figure 14:
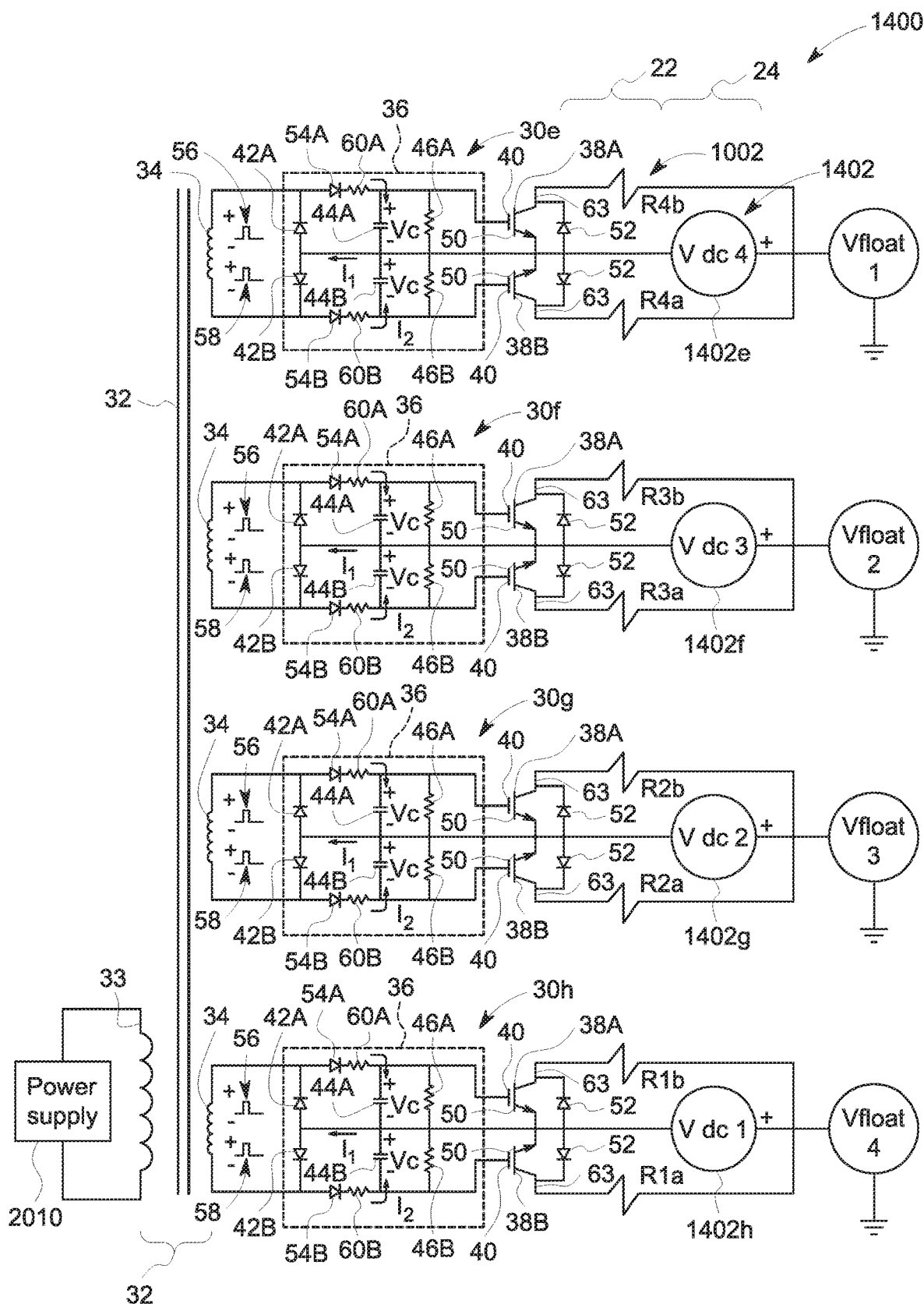
FIG. 14 illustrates another embodiment of a switching system.

FIG. 14 illustrates another embodiment of a switching system 1400 that uses the gate drive circuit device 30 discussed above. The switching system 1400 can include one or more of the gate drive circuit devices 30 (e.g., devices 30e-h in FIG. 14) to control the supply of different voltages from different voltage sources 1402 (e.g., sources 1402e-h in FIG. 14) to different loads (e.g., loads R1a, R1b, R2a, R2b, R3a, R3b, R4a, and R4b in FIG. 14). The voltage sources 1402 can be referenced to or float at different voltages (e.g., Vfloat1, Vfloat2, Vfloat3, and Vfloat4 in FIG. 14) in one embodiment. The voltage sources 1402 can represent at least part of the power source 24 shown in FIG. 1, and the loads R1a, R1b, R2a, R2b, R3a, R3b, R4a, R4b can represent at least part of the load and cable 22 shown in FIG. 1.

Each of the gate drive circuit devices 30, along with switches 38s and diodes 52s, can separately control a different voltage source 1402 to control how much voltage is supplied to one or more loads R1a, R1b, R2a, R2b, R3a, R3b, R4a, and R4b in a subset of the loads R1a, R1b, R2a, R2b, R3a, R3b, R4a, and R4b shown in FIG. 14. For example, the gate drive circuit device 30f can control whether the voltage from the voltage source 1402f is applied to the load R2a, the load R2b, none, or both the loads R2a, R2b. The gate drive circuit devices 30 are shown as being coupled to different secondary windings 34 of the same transformer device 32 in FIG. 14, but alternatively may be connected to different transformer devices 32. Additionally, although there is a single power supply 2010 shown in FIG. 14 to control which gate drive circuit devices 30 are activating or deactivating different switching devices 38a, 38b, optionally, several power supplies 2010 can be used along with several transformers, to give even greater control. All the switching devices 38a are on or off at the same time, as well as all the switching devices 38b are on or off at the same time, in one embodiment. For example, turning on the switching devices 38a involves turning on all the switching devices 38a, turning on the switching devices 38b involves turning on all the switching devices 38b, turning the switching devices 38a off involves turning all the switching devices 38a off, and turning the switching devices 38b off involves turning all the switching devices 38b off in one embodiment.

In operation, each gate drive circuit device 30 can receive one or more positive and/or negative pulses 56, 58 from the power supply 2010 to separately control which of the two loads R1a, R1b, R2a, R2b, R3a, R3b, R4a, R4b are powered. For example, the gate drive circuit device 30e can receive one or more negative pulses 58 from the power supply 2010 to activate the switching device 38b. Closure of the switching device 38b causes the voltage supplied by the voltage source 1402e to be applied through the switching device 38b to the load R1b. The gate drive circuit device 30e can receive one or more positive pulses 56 from the power supply 2010 to activate the switching device 38a. Closure of the switching device 38a causes the voltage supplied by the voltage source 1402e to be applied through the switching device 38a to the load R4a. Other gate drive circuit devices 30 can operate in a similar manner, as described above. This permits the gate drive circuit devices 30 to rapidly control the conduction of voltage to different loads.

Figure 15:
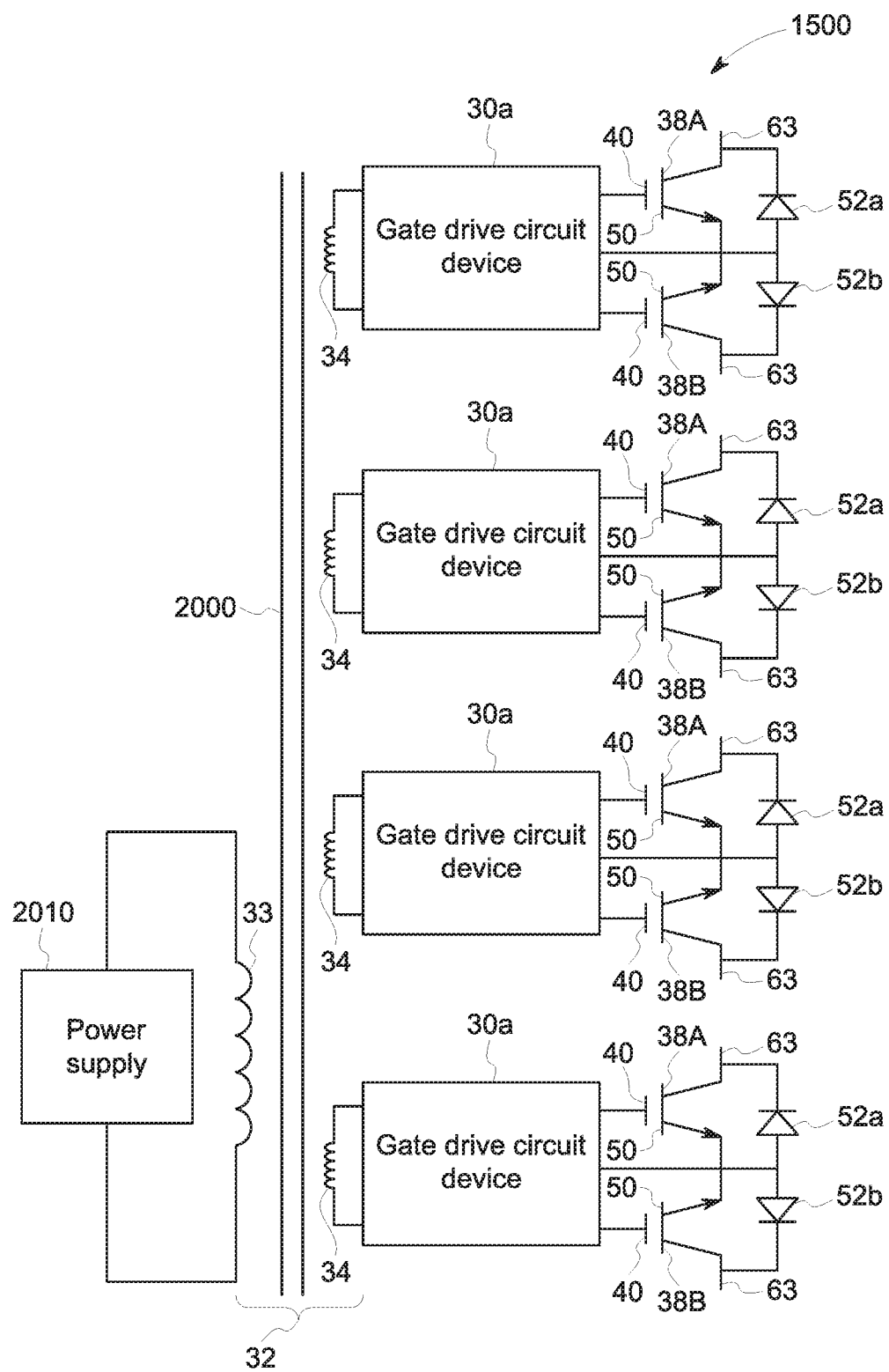
FIG. 15 illustrates another embodiment of a switching system.

FIG. 15 illustrates another embodiment of a gate drive switching system 1500. The switching system 1500 demonstrates how several gate drive circuit devices 30 can receive positive and/or negative pulses 56, 58 from a single power supply 2010 via the same single transformer device 32. Each of the gate drive circuit devices 30 can be coupled with a different secondary winding 34. These several secondary windings 34 are inductively coupled with the same primary winding 33 via the same transformer core 2000. The primary winding 33 is coupled with the power supply 2010. The diodes 52a, 52b can be conductively coupled with power sources, loads, capacitors, etc., as described herein to control conduction of voltage from the power sources to power the loads.

In operation, the power supply 2010 is controlled (e.g., by a controller that includes one or more processors) to generate one or more positive and/or negative pulses 56, 58 to the primary winding 33, as described above. The transformer device 32 inductively transfers the positive and/or negative pulses 56, 58 to each of the secondary windings 34. The positive and/or negative pulses 56, 58 are then conducted into the gate drive circuit devices 30 to control which of the switching devices 38a, 38b are activated or deactivated, as described above. Using a single transformer device 32 having multiple secondary windings 34 in this way can significantly reduce the size needed for the switching device 1500 to operate. The drain terminals 63 (or collector for an IGBT) can each be connected to a circuit that is separate or independent of the circuits connected with other terminals 63 in one embodiment.

Figure 16A:
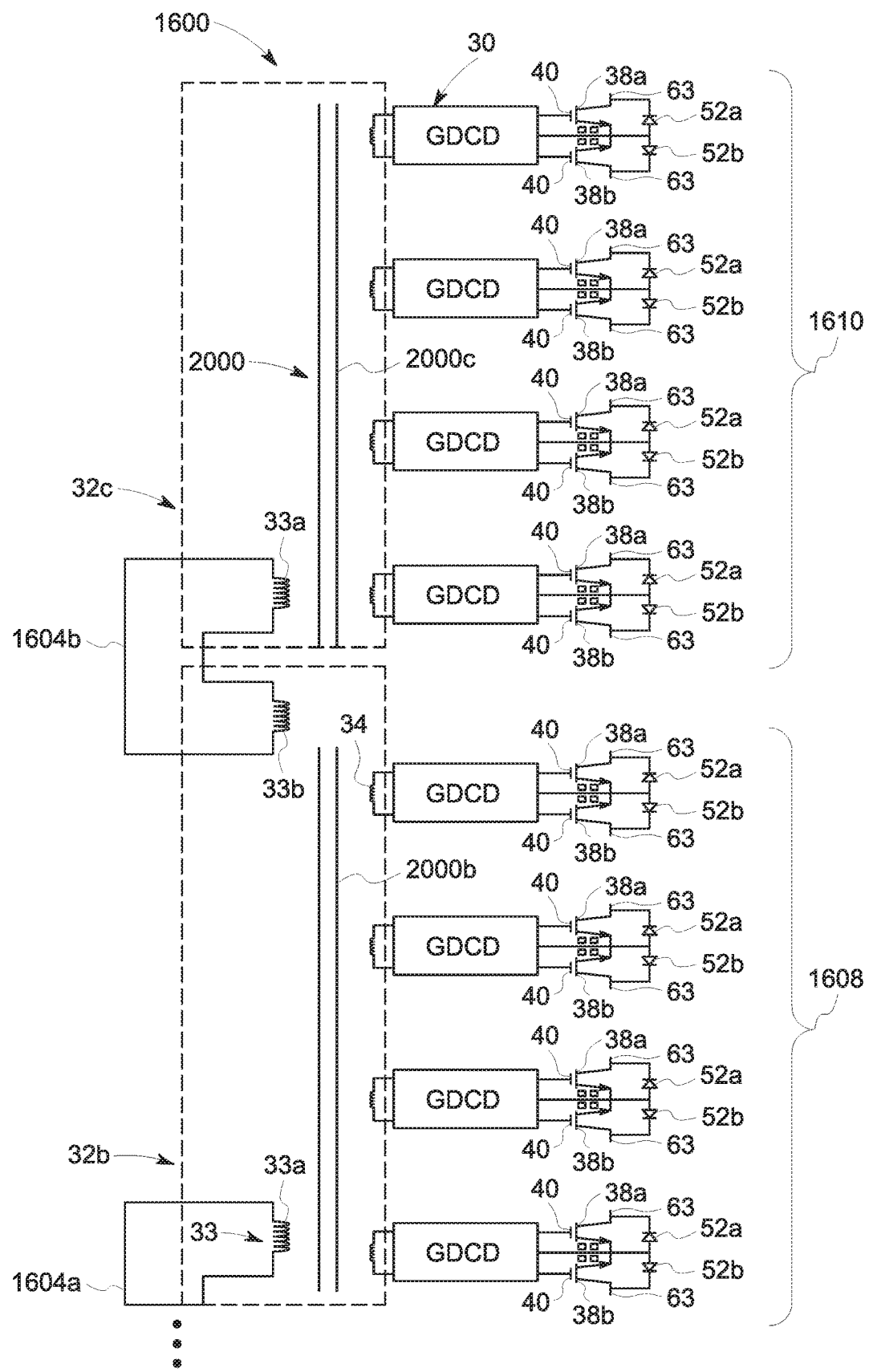
FIGS. 16A-16B illustrate another embodiment of a switching system.
Figure 16B:
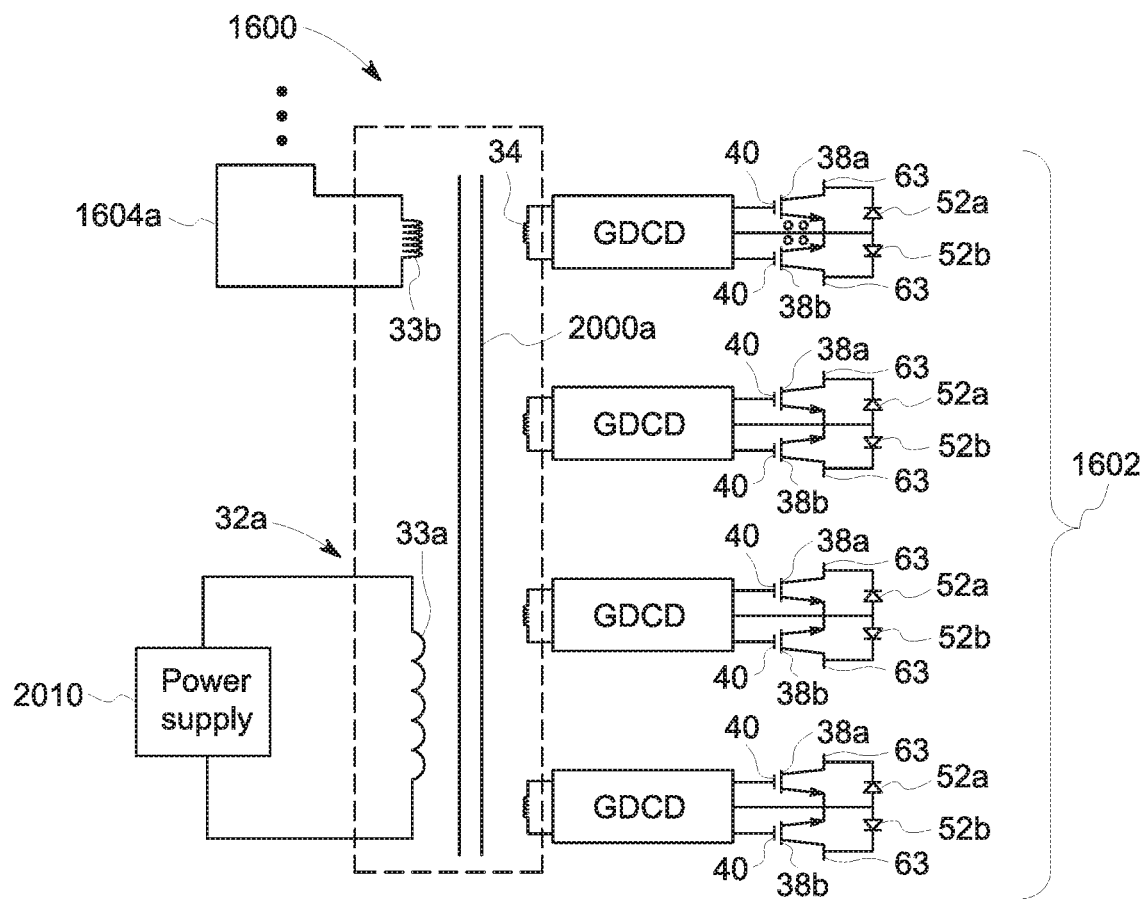

FIGS. 16A-16B illustrate another embodiment of a gate drive system 1600. The gate drive system 1600 demonstrates how several gate drive circuit devices 30 can receive positive and/or negative pulses 56, 58 from a single power supply 2010 via multiple primary and secondary windings of transformers. Each of the gate drive circuit devices 30 can be coupled with different secondary windings 34. Different groups of the secondary windings 34 are inductively coupled with different primary windings 33 (e.g., primary windings 33a-e) via different transformer cores 2000, as shown in FIG. 16A-16B.

Each of the inductive connections can inductively couple different secondary windings 34 of different transformers 32a-c. While three transformers 32 are shown in FIGS. 16A-16B, alternatively, a greater or lesser number of transformers 32 can be used. A first primary winding 33a of a transformer device 32a may be conductively coupled with the power supply 2010 and inductively coupled with the secondary windings 34 of a first group 1602 of the gate drive circuit devices 30. Pulses 56 and/or 58 received by the first primary winding 33a from the power supply 2010 can be inductively transferred to the secondary windings 34 of the gate drive circuit devices 30 in the first group 1602 to control activation or deactivation of the switching devices 38a, 38b in the second group 1608, as described above. The pulses 56 and/or 58 received by the first primary winding 33a from the power supply 2010 are inductively transferred to the second primary windings 33b via the core 2000a. The primary winding 33a of the transformer 32a can be referred to as a receiving primary winding as the primary winding 33a of the transformer 32a receives the pulses 56, 58 from the power supply 2010. The primary winding 33a of the transformer 32a transfer the pulses 56, 58 to the secondary windings 34s and primary winding 33b of the transformer 32a via the core 2000. The primary winding 33b of the transformer 32a can be referred to as a transferring primary winding as the primary winding 33b transfers the pulse 56, 58 to the primary winding 33a of the transformer 32b via the conductive connection 1604a. The primary winding 33a of the transformer 32b can be referred to as a receiving primary winding as the primary winding 33a of the transformer 32b receives the pulse 56, 58 from the transferring primary winding 33b of the transformer 32a via the conductive connection 1604a.

A second transformer 32b has a first primary winding 33a that also receives a replicated pulse 56, 58 from the second primary winding 33b of the first transformer 32a via a conductive connection 1604a. A conductive coupling or connection 1604a of the first transformer 32a is formed of conductive pathways (e.g., wires, cables, busses, etc.) that conduct the pulse 56, 58 from the second primary winding 33b of the first transformer 32a to the first primary winding 33a of the second transformer 32b. This primary winding 33a of the second transformer 32b replicates or otherwise inductively transfers the pulse 56, 58 to the secondary windings 34 of the gate drive circuit devices 30 in a second group 1608 via a second ferromagnetic core 2000b to control activation or deactivation of the switching devices 38a, 38b in the second group 1608, as described above. The pulses 56 and/or 58 received by the first primary winding 33a of the second transformer are inductively transferred to the second primary windings 33b of the second transformer as well. The primary winding 33a of the transformer 32b can be referred to as a receiving primary winding as the primary winding 33a receives the pulse 56, 58 from the primary winding 33b of the transformer 32a via the conductive connection 1604a. The primary winding 33a of the transformer 32b transfer the pulses 56, 58 to the secondary winding 34s and to the primary winding 33b of the transformer 32b via the core 2000b. The primary winding 33b of the transformer 32c can be referred to as a transferring primary winding as the primary winding 33b of the transformer 32c transfers the pulse 56, 58 to the primary winding 33a of the transformer 32c via the conductive connection 1604b.

A third transformer 32c has a first primary winding 33a that also receives a replicated pulse 56, 58 from the second primary winding 33b of the second transformer 32b via a second conductive coupling 1604b. A conductive coupling 1604b of the third transformer 32c is formed of conductive pathways that conduct the pulse 56, 58 from the second primary winding 33b of the second transformer 32b to a first primary winding 33a of the third transformer 32c. This first primary winding 33a of the third transformer 32c replicates or otherwise inductively transfers the pulse 56, 58 to the secondary windings 34 of the gate drive circuit devices 30 in a third group 1610 via a third ferromagnetic core 2000c to control activation or deactivation of the switching devices 38a, 38b in the third group 1610, as described above. The pulses 56 and/or 58 received by the first primary winding 33a of the third transformer are inductively transferred to the second primary windings 33b of the third transformer as well.

Using the transformers 32 can increase the maximum isolation voltage of the different groups of the gate drive circuit devices 30 from ground or reference while keeping the overall size of the system 1600 small. For example, the voltage withstanding capability (e.g., the breakdown voltage) of a device can increase with increasing dielectric thickness or distance between conductive bodies that form the device. With respect to the system 1600 shown in FIGS. 16A-16B, the breakdown voltage of the different gate drive circuit devices 30 can increase the farther that each device 30 is from the power supply 2010. Using several cores 2000 and interconnection devices 1604 can increase the distance (e.g., the minimum voltage breakdown) between the different groups of the devices 30, without having to add more insulation (e.g., via increased separation distance) to the devices 30. For example, the different groups of the devices 30 can be stacked on top of each other with a separate core 2000 of separate transformer devices 32 located within each group of the devices 30. The conductive connection 1604a in each interconnection device 1604 can extend from one group of devices 30 to another group of devices 30 within the stack. As more groups of the devices 30 are added to the stack, the minimum voltage breakdown between the power supply 2010 and one or more of the farthest groups of the devices 30 increases without increasing the footprint of the system 1600. For example, each group of the devices 30 can extend over a footprint, and this footprint may be repeated for each group of the devices 30. Stacking the groups on top of each other significantly increases the separation distance between one or more of the groups of devices 30 and the power supply 2010 without taking up more footprint space beneath or around the stack.

Figure 17:
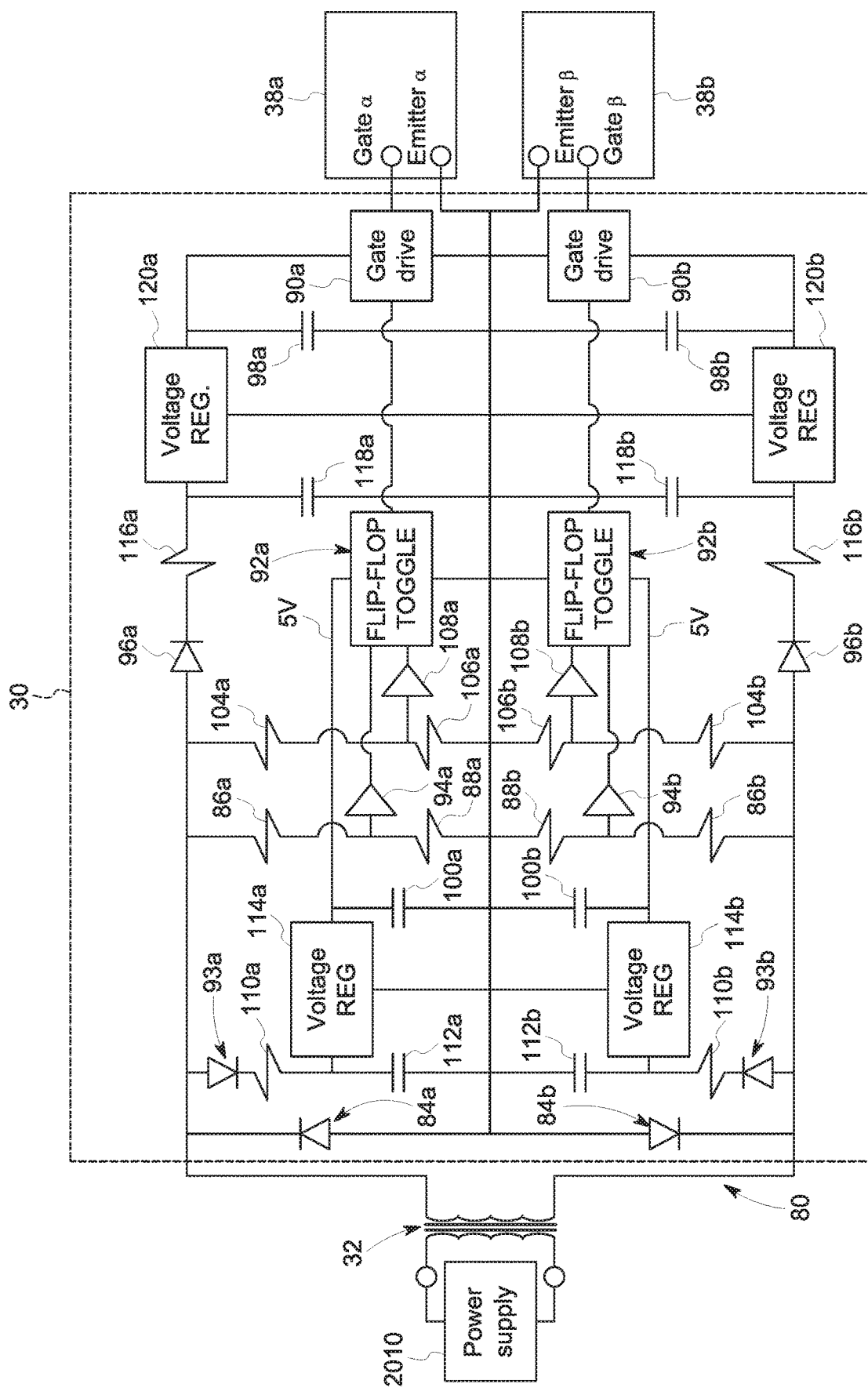
FIG. 17 is schematic diagram of a switching drive arrangement in accordance with another embodiment.
Figure 18:
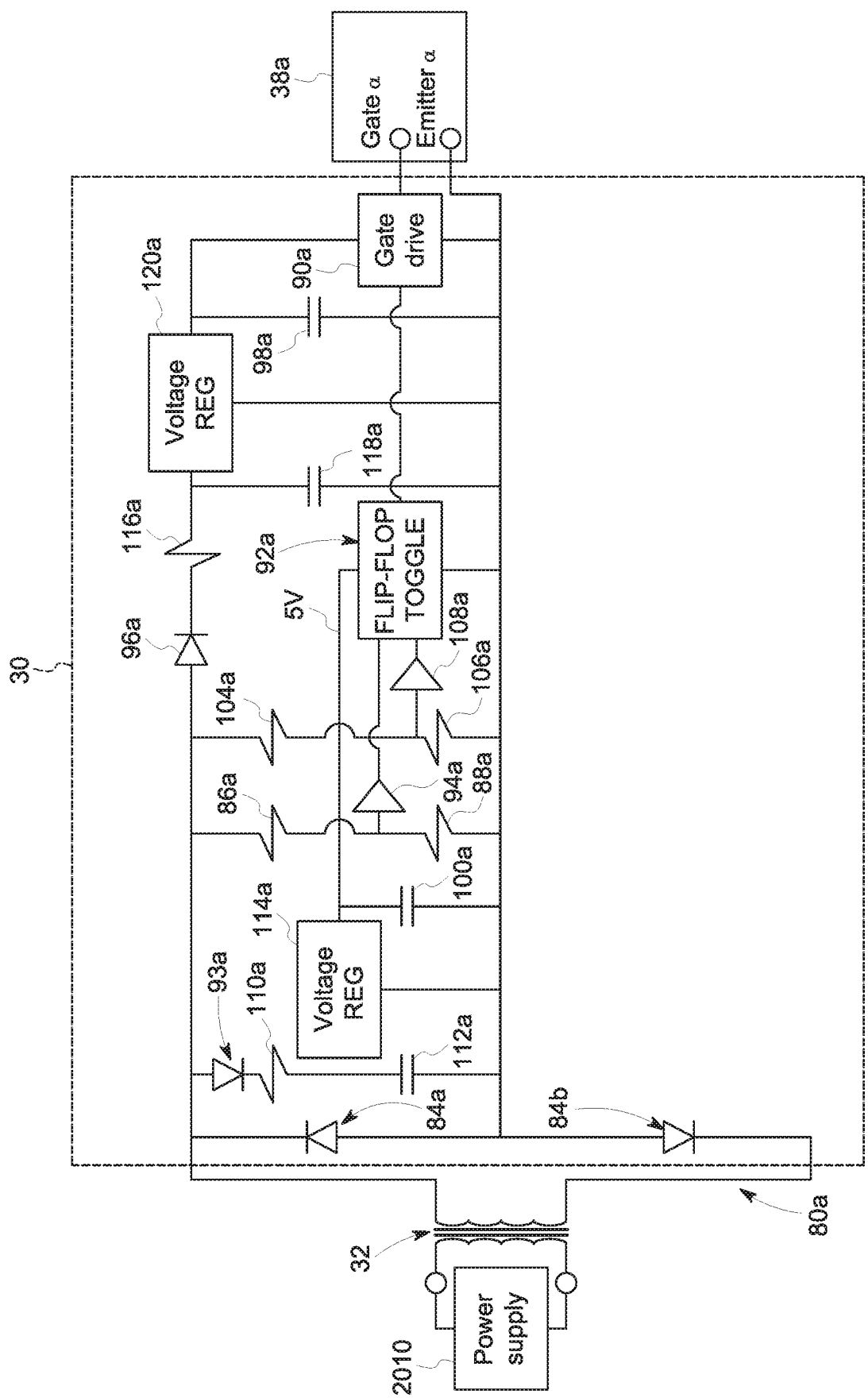
FIG. 18 is schematic diagram of a switching drive arrangement in accordance with another embodiment.
Figure 19:
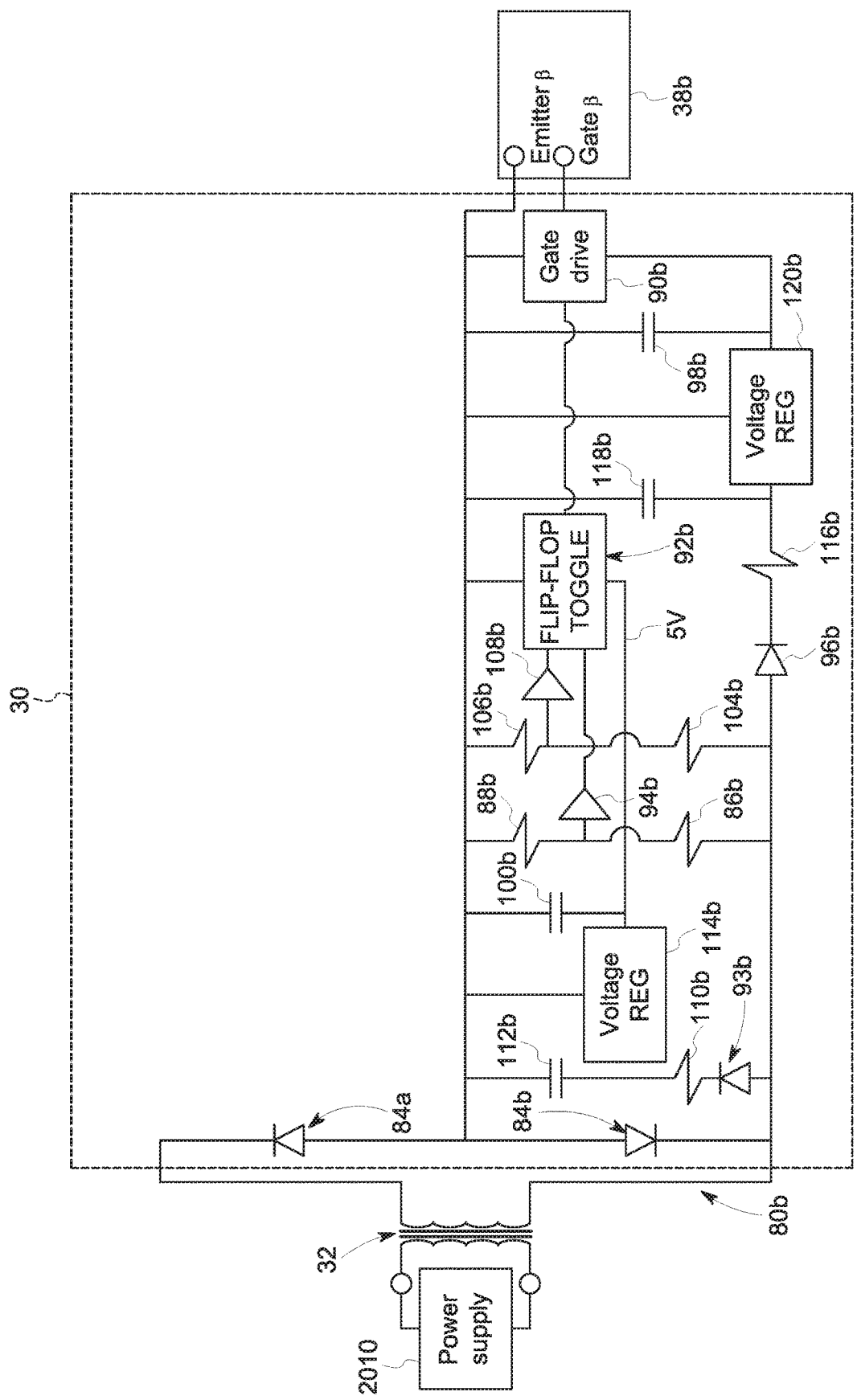
FIG. 19 is schematic diagram of a switching drive arrangement in accordance with another embodiment.

Other embodiments may provide an active gate drive circuit device 30, for example, as shown in FIGS. 17 through 19. FIG. 17 is schematic diagram of a switching drive arrangement in accordance with another embodiment. FIG. 18 is schematic diagram of a switching drive arrangement in accordance with another embodiment. FIG. 19 is schematic diagram of a switching drive arrangement in accordance with another embodiment. The active gate drive circuit devices 30 may require constant power (e.g., a constant supply of five volts, fifteen volts, or another voltage) to operate properly. In the embodiment shown in FIG. 17, a pair of gate drive devices 90a and 90b are controlled by signals from the transformer 32 using a pair of flip-flops 92a and 92b operating in a toggle mode. The embodiments shown in FIGS. 18 and 19 can be stand-alone if only one device (38a or 38b) needs to be operated. The device 30 shown in FIGS. 17 through 20 may be referred to as an active device or arrangement, while the device 30 described above may be referred to as a passive device or arrangement. Although the active gate drive circuit device 30 is shown controlling a pair of gate drive devices 90a and 90b, each gate drive device 90a and 90b may be separately controlled by a corresponding transformer 32, such that the top and bottom portions of the circuit shown in FIG. 17 are separated (e.g., not in a common emitter configuration). These alternative arrangements are shown in FIGS. 18 (top portion) and 19 (bottom portion).

The active gate drive circuit device 30 includes a pair of diodes 84 each connected in parallel with a pair of resistors 86 and 88. Each separate elements of the pair is labeled using "a" and "b", for example, diodes 84a and 84b. The pair of resistors 86 and 88 form a resistive voltage divider with a buffer 94 connected therebetween. The output of the buffer 94 is connected to the clock pin of the flip-flop 92 and the output (illustrated as the q output) of the flip-flop 92 is connected to the gate drive device 90. Similarly, the diodes 84 are each connected in parallel with another pair of resistors 104 and 106. The pair of resistors 104 and 106 forms another resistive divider with another buffer 108 connected therebetween. The output of the buffer 108 is connected to the RESET pin of the flip flop 92. The series of the diode 93, resistor 110, and capacitor 112 are connected in parallel with the diode 84.

Further, the input of the voltage regulator 114 is connected in parallel with the capacitor 112 and the output is connected in parallel with the capacitor 100 and the 5V reference voltage (although other reference voltages may be used) of the flip-flop 92. Similarly, the series connection of the diode 96, the resistor 116, and the capacitor 118 are connected in parallel with the diode 84. The input of the 15V voltage regulator 120 (although other voltage inputs may be used) is connected in parallel with the capacitor 118 and the output is connected in parallel with the other capacitor 98 and the 15V reference voltage of the gate drive 90. Additionally, the output of the gate drive device 90 and the switching devices 38a, 38b are connected in a common emitter configuration.

Figure 20:
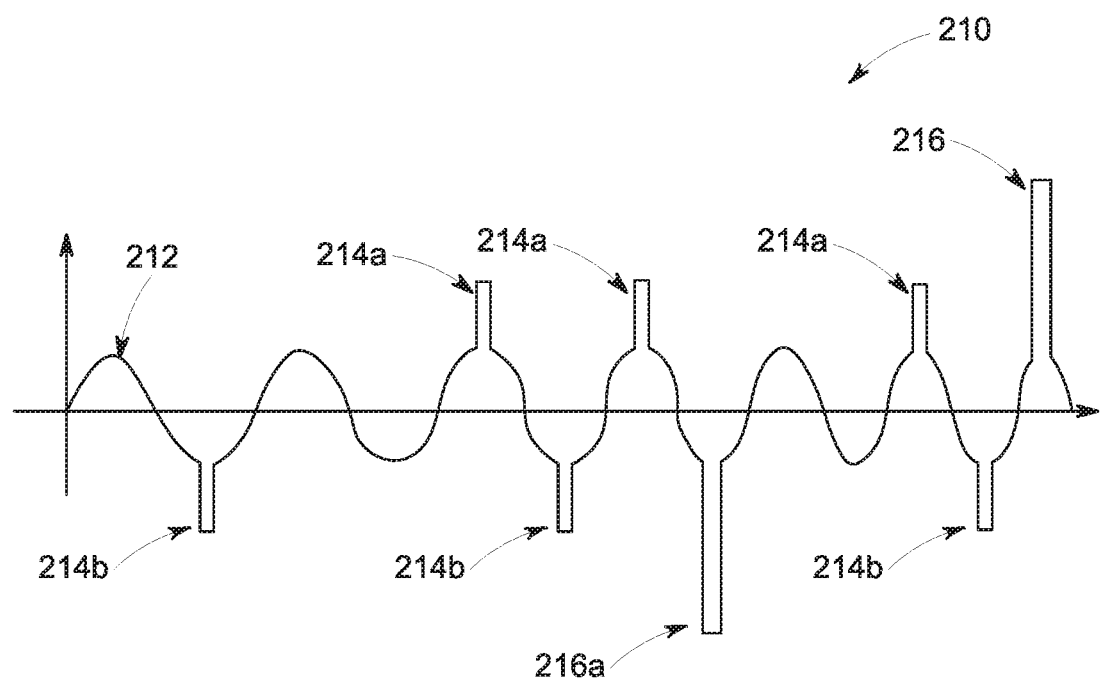
FIG. 20 is a diagram of a voltage waveform in accordance with an embodiment.

FIG. 20 is a diagram of a voltage waveform in accordance with an embodiment. In operation, a voltage waveform 210 such as shown in FIG. 20 may be applied to the input terminals of the transformer 32. The voltage waveform 210 in some embodiments is formed by three components. The voltage waveform 210 is provided as one example and different waveforms having different components may be used. One component 212, the sinusoidal portion, provides power to the gate drive circuit device 30 and the logic component such as the flip-flop 92 and has relatively small amplitude (e.g., 16V). The second component 214 (referred to as pulses) provides the signal for the clock of the flip-flop 92 and has an amplitude larger than the first component (e.g., 20V), and is limited in duration. This component is used to toggle the flip-flop output. The third component 216 has the largest amplitude (e.g., 24V) and is used to reset the flip-flop 92 when needed (referred to as large pulses). The positive portion of the waveform 210 provides power and signals to the components connected in parallel with the diode 84a, and the negative portion provides power and signals to the components connected in parallel with the diode 84b.

For example, the polarity of the voltage pulses 214 may be used to control the switching on and off the switching devices 38a, 38b using the flip-flops 92 as described in more detail below. In this embodiment, the switching device 38a or 38b may be maintained on or switched off by sending different numbers or types of pulses as part of a waveform 210. In FIG. 20, the positive components labeled with an "a" (such as 214a and 216a) control the "a" or top half portion shown in FIG. 17 and FIG. 18, and the negative components labeled with a "b" (such as 241b and 214b) control the "b" or bottom half of portion shown in FIG. 17 and FIG. 19.

As can be seen, the waveform 210 defines a pulse train having lower amplitude components 212, medium amplitude components (pulses) 214, namely pulses having a higher amplitude than components 212, and larger amplitude pulses 216, namely having higher amplitude than the pulses 214. In the illustrated embodiment, the waveform 210 defines signals that are used to send the power for powering flip flop 92 and the gate drive 90, the pulses 214 are used to toggle the output of the flip-flops 92, and the pulses 216 are used to reset the flip flop 92, resulting in control signals being output that cause the switching device 38a or 38b to turn on or off (e.g., because the signal is sent to the clock). In operation, for example, an even or odd number of higher pulses 214, for example, 2 or 1, may be used to turn on and off the switching devices 38a, 38b). The even higher amplitude pulse 216 (e.g., higher amplitude than 212 and 214) may be sent, which resets the flip-flops 92 to a known state (at a voltage level to drive the reset (r) input of the flip-flop 92). Thus, for example, with a JK flip-flop operating in a toggle mode, the switching devices 38a, 38b may be turned on and off by the number of pulses sent through the primary of the transformer 32. Also, if the signal frequency is too low, the capacitors 100 may be recharged by a pulse smaller in amplitude, namely the pulses 212, without triggering the signal circuitry. The power can be sent with the signal through the sole transformer primary winding.

In the illustrated embodiment, the power (e.g., +5V) is sent through the transformer 32, rectified and filtered by the diode 93, the resistor 110 and the capacitor 112, then regulated to 5V constant by the voltage regulator 114 and the capacitance of the capacitor 100. Similarly, the power for the gate drive (e.g. 15V) is sent through the transformer 32, rectified and filtered by the diode 96, the resistor 116, and the capacitor 118, then regulated to 15V constant by the voltage regulator 120 and the capacitance 98. The complementary q output of the flip-flops 92 may be used to control an additional switch that is referenced to the same voltage level of the main switches (e.g., the switching devices 38a, 38b), but is complementary thereto.

Moreover, in this embodiment, the controlling signals are also sent through the transformer 32. The voltage regulators 114 and 120 will not be affected by the controlling pulses 214 or 216 because of the pulses short duration and the filtering action of the resistor 110 and capacitor 112, and the resistor 116 and the capacitor 118 respectively. The resistive divider formed by the resistors 86 and 88 is sized such that the pulse appearing at the input of the buffer 94 is large enough to be changed into "logic 1" only if the magnitude of the pulse 214 exceeds a certain threshold voltage. The resistive divider formed by resistor 104 and resistor 106 is sized such that a pulse 214 that is large enough to be changed into "logic 1" by the buffer 94 is not large enough to be changed into "logic 1" by the buffer 108. Accordingly, only pulses such as 216 will be changed into "logic 1" by the buffer 108 and reset the flip-flop 92. If a pulse is large enough to reset the flip-flop 92, that same pulse creates a clock signal as well, which is not an issue since the reset command overrides all other commands including the signal on the clock. Additionally, the logic inputs to the flip-flop 92 will be protected by over-voltages by voltage limiters (not shown).

Figure 21:
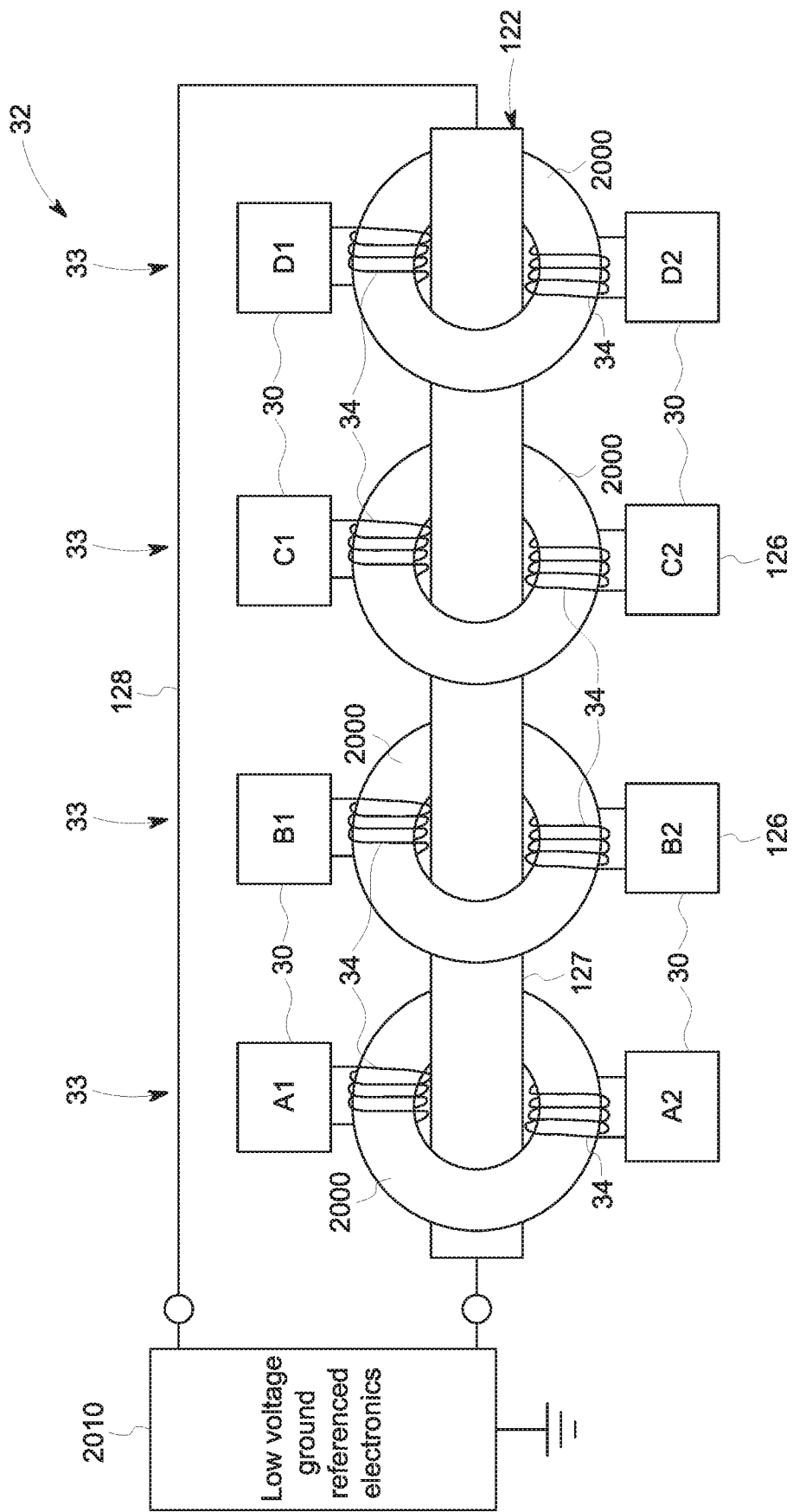
FIG. 21 is a diagram illustrating a gate transformers arrangement in accordance with various embodiments.
Figure 22:
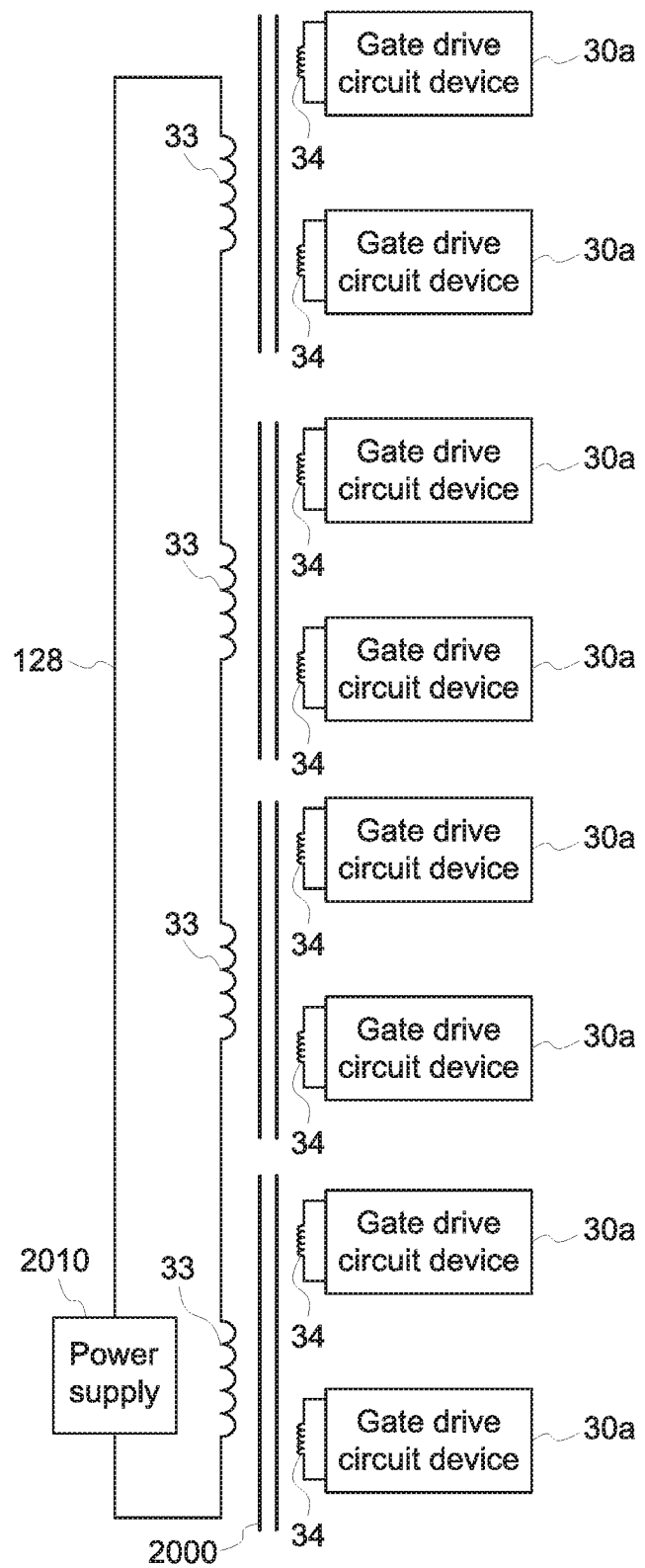
FIG. 22 is a schematic diagram of the gate transformers arrangement shown in FIG. 21.

Another embodiment of the voltage switching control with a shared primary winding, may be implemented as generally illustrated in FIG. 21 and represented in a schematic form in FIG. 22. For example, the switching control may be implemented with the transformer 32 (operating as a part of a high voltage generator) with a primary winding 33 on each side shared by cores 2000 of the transformer 32. The transformer 32 includes a plurality of the secondary windings 34 connected with each of the primary windings 33 and with the gate drive circuit device 30, which may be the passive drive arrangement 30 or the active gate drive circuit device 30. The illustrated embodiment shows eight secondary windings 34: four toroids (or cores) 2000 with two windings each, connected with the primary winding 33. However, additional toroids or windings per toroid may be provided. Additionally, although the primary windings 33 (also referred to as the primaries) of the transformer 32 are connected in series, a parallel, or cascaded connection of the primary side of the isolation transformers 32 may be provided.

In the illustrated embodiment, the section 127 of the primary windings 33 is insulated, while the section 128 of the primary windings 33 may be not insulated. Additional transformers 32 may be provided, for example, up to forty or more. The primary windings 33 are also connected to a power source 2010, which may be low voltage ground referenced electronics, to generate the voltage pulses as described herein.

The gate drive circuit devices 30 connected with the secondary windings 34 are used to control voltage switching as described in more detail herein. The gate drive circuit devices 30 may include protection elements as desired or needed.

In operation, various embodiments allow control of two or more sets of devices that can be at the same voltage reference and/or different voltage references. The voltage references (as well as the number and value of each) may be varied as desired or needed, as well as the values of the component parts of the various embodiments. The various embodiments can control two or more sets of devices independently, as well as at two or more different frequencies, although the frequencies are integer multiples of each other.

Figure 23:
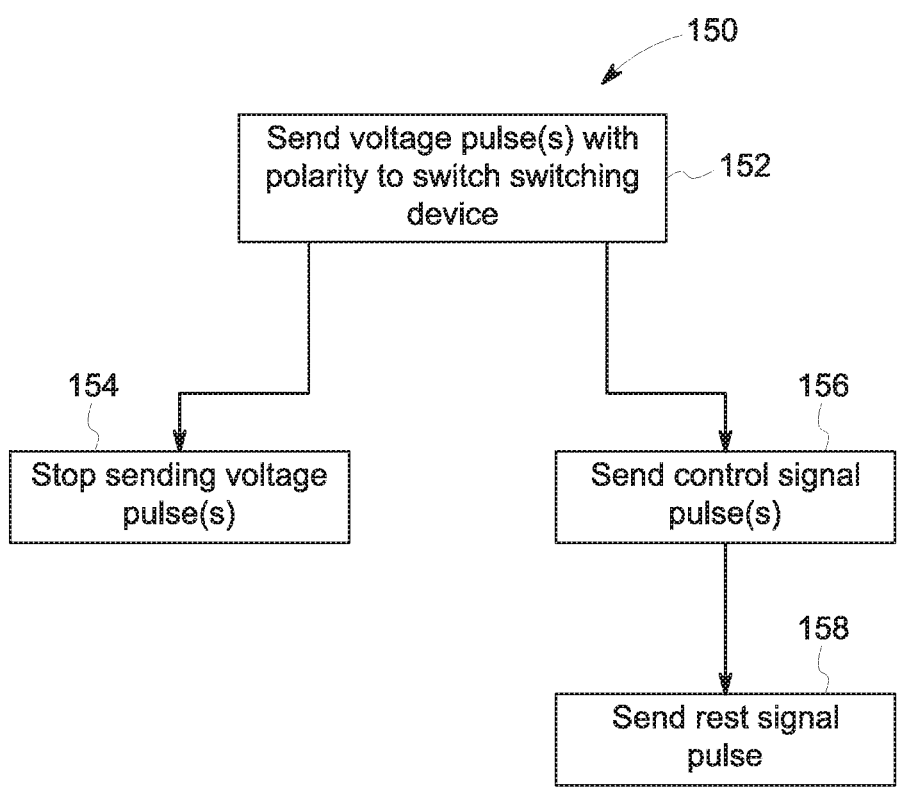
FIG. 23 is a flowchart of a method for controlling voltage switching in accordance with various embodiments.

Various embodiments provide a method 150 as shown in FIG. 23 for controlling voltage switching, for example, to control switching of a plurality of devices that are referenced to different voltages, which in some embodiments, are high voltages (e.g., 10 kV or higher). The method 150 includes sending one or more voltage pulses through the primary of one or more transformers as described herein. The voltage pulses have a polarity to turn on one of two switching devices in some embodiments. In a passive control arrangement as described herein, the switching device is turned off by stopping the sending of the voltage pulses. In an active control arrangement, the voltage pulses provide power signals to the switching devices from an on-board power supply. In this embodiment, one or more control signal pulses (e.g., odd or even number of pulses) may be sent to turn on or off the switching devices. Additionally, a reset signal pulse may be sent to reset the switching to a default operating mode, for example, a default operating mode of a flip-flop as described herein.

Figure 25:
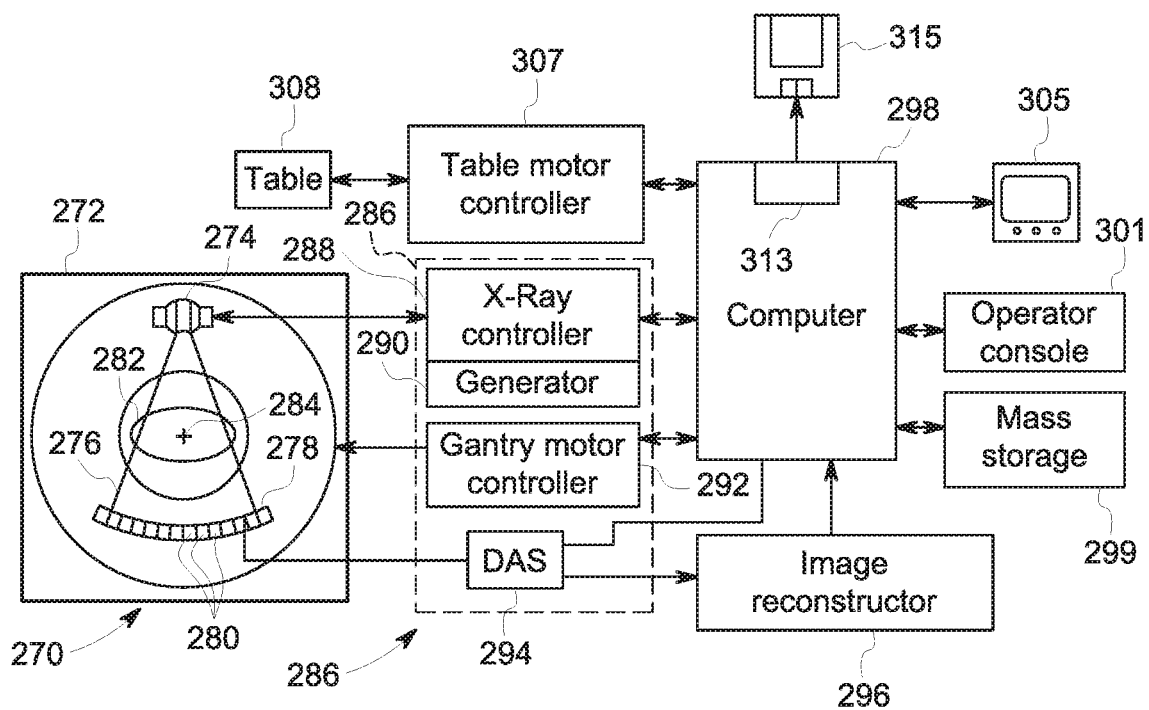
FIG. 25 is a block schematic diagram of the CT imaging system of FIG. 24.
Figure 26:
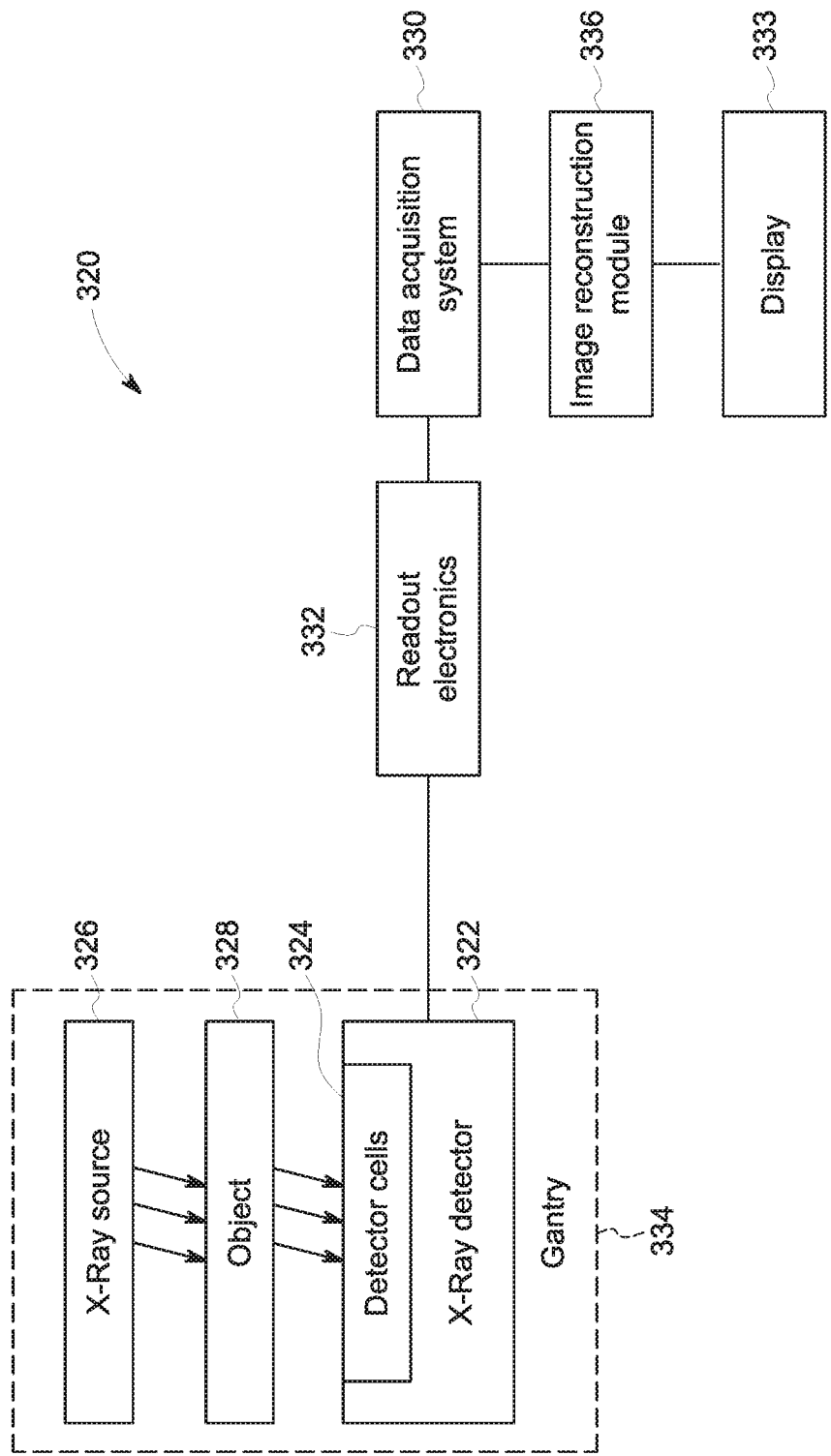
FIG. 26 is a schematic block diagram of an x-ray imaging system in connection with which various embodiments may be implemented.

The various embodiments may be implemented in different systems using high-voltage sources. For example, the various embodiments may be implemented in connection with a CT imaging system as shown in FIGS. 24 and 25, or an x-ray imaging system as shown in FIG. 26, which may be a radiographic or x-ray tomosynthesis system.

Figure 24:
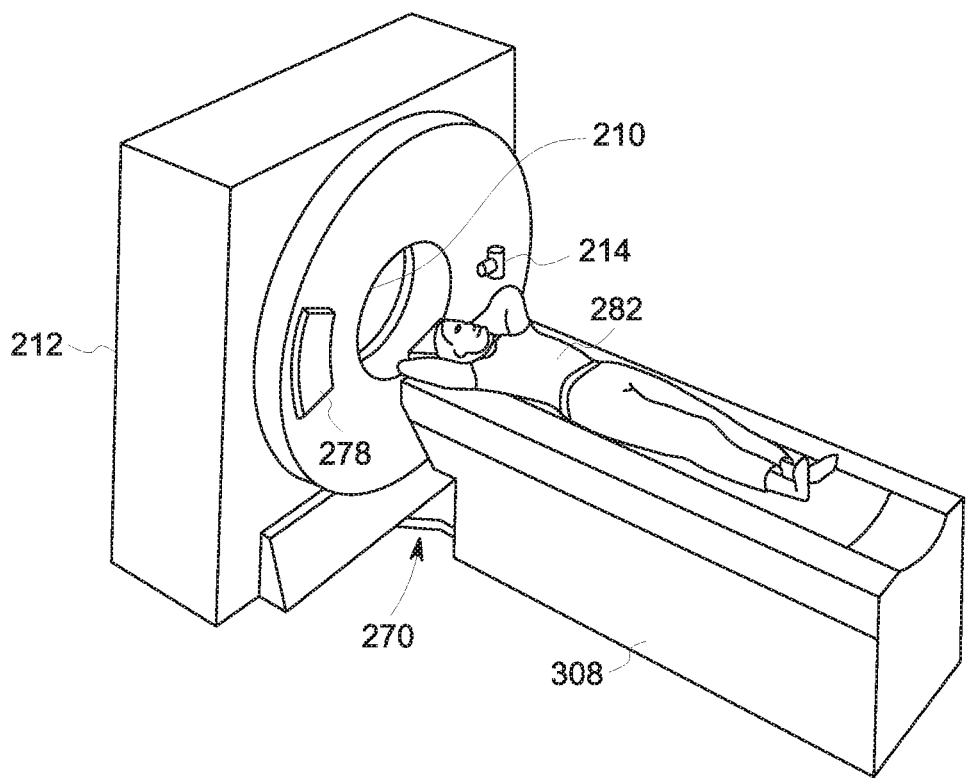
FIG. 24 is a pictorial view a computed tomography (CT) imaging system in connection with which various embodiments may be implemented.

FIG. 24 is a pictorial view of a CT imaging system 270. FIG. 25 is a block schematic diagram of the system 270 illustrated in FIG. 24. In the exemplary embodiment, the CT imaging system 270 is shown as including a gantry 272 representative of a "third generation" CT imaging system. The gantry 272 has an x-ray source 274 that projects a cone beam 276 of x-rays toward a detector array 278 on the opposite side of gantry 272.

The detector array 278 is formed by a plurality of detector rows (not shown) including a plurality of detector elements 280 that together sense the projected x-ray beams that pass through an object, such as a medical patient 282 or piece of baggage. Each detector element 280 produces an electrical signal that represents the intensity of an impinging x-ray radiation beam and hence the attenuation of the beam as it passes through object or patient 282. The imaging system 270 having a multi-slice detector 278 can provide a plurality of images representative of a volume of object 282 (e.g., a patient or other object). Each image of the plurality of images corresponds to a separate "slice" of the volume. The "thickness" or aperture of the slice is dependent upon the height of the detector rows.

During a scan to acquire x-ray projection data, a rotating portion (not shown) within the gantry 272 and the components mounted thereon rotate about a center of rotation 284. FIG. 25 shows only a single row of detector elements 280 (i.e., a detector row). However, the multi-slice detector array 278 includes a plurality of parallel detector rows of detector elements 280 such that projection data corresponding to cone-beam geometry can be acquired simultaneously during a scan.

Rotation of the gantry 272 and the operation of radiation source 274 are governed by a control mechanism 286. The control mechanism 286 includes an x-ray controller 288 and generator 290 that provides power and timing signals to the x-ray source 274 (such as using the passive drive arrangement 30 or active gate drive circuit device 30) and a gantry motor controller 292 that controls the rotational speed and position of rotating portion of gantry 272. A data acquisition system (DAS) 294 in the control mechanism 286 samples analog data from detector elements 280 and converts the data to digital signals for subsequent processing. An image reconstructor 296 receives sampled and digitized measurement data from the DAS 294 and performs high-speed image reconstruction. The reconstructed image is applied as an input to a computer 298 that stores the image in a mass storage device 299. Although shown as a separate device, image reconstructor 296 may be special hardware located inside computer 298 or software executing within computer 298.

The computer 298 also receives commands and scanning parameters from an operator via a console 301 that has a keyboard and/or other user input device(s). An associated display system 305 allows the operator to observe the reconstructed image and other data from the computer 298. The operator supplied commands and parameters are used by the computer 298 to provide control signals and information to the DAS 294, x-ray controller 288, generator 290, and gantry motor controller 292. In addition, the computer 298 operates a table motor controller 307 that controls a motorized table 308 to position the patient 182 or object in the gantry 272. The table 308 moves portions of the patient through a gantry opening 310.

In one embodiment, the computer 298 includes a device 313, for example, a CD-ROM drive, DVD-ROM drive, or a solid state hard drive for reading instructions and/or data from a computer-readable medium 315, such as a CD-ROM, or DVD. It should be understood that other types of suitable computer-readable memory are recognized to exist (e.g., CD-RW and flash memory, to name just two), and that this description is not intended to exclude any of these. In another embodiment, the computer 298 executes instructions stored in firmware (not shown). Generally, a processor in at least one of the DAS 294, reconstructor 296, and computer 298 shown in FIG. 25 is programmed to execute control commands to perform switching as described in more detail herein. The switching is not limited to practice in the CT system 270 and can be utilized in connection with many other types and variations of imaging systems. In one embodiment, the computer 298 is programmed to perform different functions to switch the switching devices described herein, accordingly, as used herein, the term computer is not limited to just those integrated circuits referred to in the art as computers, but broadly refers to computers, processors, microcontrollers, microcomputers, programmable logic controllers, application specific integrated circuits, and other programmable circuits.

FIG. 26 illustrates an x-ray imaging system 320 in which various embodiments may be implemented. The imaging system 320 generally includes an x-ray detector 322 having an array of detector cells 324 defining a scan area, and an x-ray source 326. An object 328, such as a patient or piece of luggage is positioned between the x-ray source 326 (the voltage switching of which may be controlled using the passive drive arrangement 30 or active gate drive circuit device 30) and the x-ray detector 322, which may be one or more detectors or detector modules. However, the imaging system 320 may also scan other objects, such as in an industrial inspection application. The imaging system 320 also includes a data acquisition system 330, which interacts with readout electronics 332. The readout electronics 332 may reside inside x-ray detector 322 or the data acquisition system 330.

In one embodiment, the x-ray detector(s) 322 may be flat-panel detector systems such as an amorphous silicon flat panel detector or other type of digital x-ray image detector, such as a direct conversion type detector, as is known to those skilled in the art. In another embodiment, the x-ray detector(s) 322 may include a scintillator having a screen that is positioned in front of the x-ray detector(s) 322.

The imaging system 320 may be implemented as a non-mobile or mobile imaging system. Moreover, the imaging system 320 may be provided in different configurations. For example, image data may be generated with the x-ray source 326 at discrete foci along a small arc above the object to generate the image information using computed tomosynthesis procedures and processes (or may be in a radiographic configuration). In other embodiments, the x-ray source 326 and the x-ray detector 322 are both mounted at opposite ends of a gantry 334, which may be a C-arm that rotates about the object 328. The rotatable C-arm is a support structure that allows rotating the x-ray source 326 and the x-ray detector 322 around the object 328 along a substantially circular arc, to acquire a plurality of projection images of the object 328 at different angles (e.g., different views or projections) that are typically less than 360 degrees, but may comprise a complete rotation in some instances.

In operation, the object 328 is positioned in the imaging system 320 for performing an imaging scan. For example, the x-ray source 326 may be positioned above, below or around the object 328. For example, the x-ray source 326 (and the x-ray detector(s) 322) may be moved between different positions around the object 328 using the gantry 334. X-rays are transmitted from the x-ray source 326 through the object 328 to the x-ray detector(s) 322, which detect x-rays impinging thereon.

The readout electronics 332 may include a reference and regulation board (RRB) or other data collection unit. The RRB may accommodate and connect data modules to transfer data (e.g., a plurality of views or projections) from the x-ray detector(s) 322 to the data acquisition system 330. Thus, the readout electronics 332 transmit the data from the x-ray detector(s) 322 to the data acquisition system 330. The data acquisition system 330 forms an image from the data and may store, display (on the display 333), and/or transmit the image. For example, the various embodiments may include an image reconstruction module 336, which may be implemented in hardware, software, or a combination thereof, that allows the data acquisition system to reconstruct images using x-ray data (e.g., radiographic or tomosynthesis data) acquired from the x-ray detector(s) 322 and as described in more detail herein.

In one embodiment, a gate drive circuit device is provided that includes a positive pulse circuit portion including a first positive pulse diode and a positive pulse assembly connected in parallel with each other. The positive pulse assembly includes a second positive pulse diode and a first resistor-capacitor assembly connected in series. The first resistor-capacitor assembly includes a positive pulse resistor and a positive pulse capacitor connected in parallel with each other. The positive pulse circuit portion also is configured to be conductively coupled with a first switch. The gate drive circuit device also includes a negative pulse circuit portion having a first negative pulse diode and a negative pulse assembly connected in parallel with each other. The negative pulse assembly includes a second negative pulse diode and a second resistor-capacitor assembly connected in series. The second resistor-capacitor assembly includes a negative pulse resistor and a negative pulse capacitor connected in parallel with each other. The negative pulse circuit portion also is configured to be conductively coupled with a second switch. The positive pulse circuit portion is configured to activate the first switch responsive to receiving one or more positive voltage pulses from a power supply. The negative pulse circuit portion is configured to activate the second switch responsive to receiving one or more negative voltage pulses from the power supply.

Optionally, the positive pulse circuit portion is configured to be conductively coupled with a conductive secondary winding of a transformer device from which the positive voltage pulse is inductively received. The negative pulse circuit portion also can be configured to be conductively coupled with the secondary winding of the transformer device from which the negative voltage pulse is inductively received.

The positive pulse circuit portion can be configured to charge the positive pulse capacitor using the one or more positive voltage pulses and the negative pulse circuit portion can be configured to charge the negative pulse capacitor using the one or more negative voltage pulses. The positive pulse capacitor that is charged with the one or more positive voltage pulses can be configured to apply a first voltage that is greater than a first turn-on threshold voltage to a gate of the first switch. The negative pulse capacitor that is charged with the one or more negative voltage pulses can be configured to apply a second voltage that is greater than a second turn-on threshold voltage to a gate of the second switch.

Optionally, one or more of the positive circuit portion or the negative circuit portion is configured to receive one or more of a positive pulse train formed of a series of the positive voltage pulses or a negative pulse train formed of a series of the negative voltage pulses. The positive capacitor of the positive circuit portion can be configured to be charged by the positive voltage pulses in the positive pulse train, and/or the negative capacitor of the negative circuit portion can be configured to be charged by the negative voltage pulses of the negative pulse train.

The positive and negative circuit portions can be configured to concurrently receive a pulse train formed of a series of one or more of the positive voltage pulses and one or more of the negative voltage pulses. The positive capacitor of the positive circuit portion can be configured to be charged by the one or more positive voltage pulses of the pulse train. The negative capacitor of the negative circuit portion can be configured to be charged by the one or more negative voltage pulses of the pulse train. The positive capacitor that is charged and the negative capacitor that is charged can be configured to concurrently activate both the first and second switches. For example, both switches can be activated at the exact same time, or one switch can be activated (but remain activated) while the other switch is subsequently activated such that both switches are activated during the same time period.

Optionally, the positive and negative circuit portions are configured to activate the first and second switches that are conductively coupled with a first output diode, a second auxiliary diode, an output capacitor, an auxiliary capacitor, an auxiliary inductance, a voltage source, and a load. The positive circuit portion can be configured to activate the first switch to direct voltage from the voltage source through the first switch, through the second auxiliary diode to bypass the second switch, through the auxiliary inductance, and into the auxiliary capacitor for storage to decrease the voltage on the load. The negative circuit portion can be configured to activate the second switch to direct voltage from the voltage source through the second switch, through the first output diode to bypass the first switch, through the auxiliary inductance, and into the output capacitor to increase the voltage on the load.

The positive circuit portion can be configured to conduct the positive voltage pulse to the positive capacitor to charge the positive capacitor and cause the positive capacitor to output a drive signal that is applied to a gate of the first switch to activate the first switch. The drive signal created by the positive capacitor can activate the first switch for a longer time period than the positive voltage pulse.

Optionally, negative circuit portion is configured to conduct the negative voltage pulse to the negative capacitor to charge the negative capacitor and cause the negative capacitor to output a drive signal that is applied to a gate of the second switch to activate the second switch. The drive signal created by the negative capacitor can activate the second switch for a longer time period than the negative voltage pulse.

In one embodiment, a switching system includes two or more of the gate drive circuit devices and two or more sets of the first and second switches. Each of the sets of the first and second switches is coupled with a different gate drive circuit device of the gate drive circuit devices. The switching system also includes two or more sets of opposing diodes, with each of the sets of the opposing diodes connected with a different set of the sets of the first and second switches. The switching system also includes auxiliary inductors each conductively coupled with different set of the opposing diodes, auxiliary capacitors each conductively coupled with different set of the opposing diodes and the auxiliary inductors, output capacitors each conductively coupled with different set of the opposing diodes, and voltage sources each conductively coupled with different set of the opposing diodes and with a different output capacitor of the output capacitors. The voltage sources also are configured to be coupled with a load.

Optionally, the gate drive circuit devices can be coupled with secondary windings of a transformer device that are inductively coupled with a primary winding of the transformer device. The gate drive circuit devices can be configured to individually control which of the voltage sources conducts voltage to power the load. Each of the gate drive circuit devices can be configured to activate the second switch to conduct the voltage from the corresponding voltage source to the corresponding output capacitor and the load.

Each of the gate drive circuit devices can be configured to activate the first switch to conduct the voltage from the corresponding voltage source and the corresponding output capacitor to the corresponding auxiliary capacitor. The two or more gate drive circuit devices can be configured to operate all of the first switches at the same time or all of the second switches at the same time. Each of the voltage sources can be referenced to a different reference voltage.

In one embodiment, a switching system includes two or more of the gate drive circuit devices and the transformer device having the primary winding, at least one transformer core, and the secondary winding of each of the gate drive circuit devices. The transformer device is configured to concurrently transfer one or more of the positive voltage pulse and the negative voltage pulse to the secondary windings of all the gate drive circuit devices.

Optionally, transformer device can include one or more transformer cores and one or more interconnection devices. Each of the interconnection devices can include plural additional primary windings conductively coupled with each other. Each of the interconnection devices can be configured to inductively couple two or more of the transformer cores with each other so that one or more of the positive voltage pulse or the negative voltage pulse is inductively transferred from the primary winding of the transformer device to the secondary windings of a first group of the gate drive circuit devices via a first core of the transformer cores, is inductively transferred from the primary winding of the transformer device to one of the additional primary windings of the interconnection device, is conducted to another one of the additional primary windings of the interconnection device, and is inductively transferred to the secondary windings of a second group of the gate drive circuit device via a separate, second core of the transformer cores.

Different examples and aspects of the apparatus and methods are disclosed herein that include a variety of components, features, and functionality. The various examples and aspects of the apparatus and methods disclosed herein may include any of the components, features, and functionality of any of the other examples and aspects of the apparatus and methods disclosed herein in any combination, and all such possibilities are intended to be within the spirit and scope of the present disclosure.

The particular arrangement of components (e.g., the number, types, placement, or the like) of the illustrated embodiments may be modified in various alternate embodiments. In various embodiments, different numbers of a given module, system, or unit may be employed, a different type or types of a given module, system, or unit may be employed, a number of modules, systems, or units (or aspects thereof) may be combined, a given module, system, or unit may be divided into plural modules (or sub-modules), systems (or sub-systems) or units (or sub-units), a given module, system, or unit may be added, or a given module, system or unit may be omitted.

The various embodiments may be implemented in hardware, software or a combination thereof. The various embodiments and/or components, for example, the modules, systems, or components and controllers therein, also may be implemented as part of one or more computers or processors. The computer or processor may include a computing device, an input device, a display unit, and an interface. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid-state drive, optical drive, and the like. The storage device may also be other similar means for loading computer programs or other instructions into the computer or processor.

As used herein, the term "computer," "controller," "system," and "module" may each include any processor-based or microprocessor-based system including systems using microcontrollers, reduced instruction set computers (RISC), application specific integrated circuits (ASICs), logic circuits, GPUs, FPGAs, and any other circuit or processor capable of executing the functions described herein. The above examples are exemplary only, and are thus not intended to limit in any way the definition and/or meaning of the term "module," "system," or "computer."

The computer, module, system, or processor executes a set of instructions that are stored in one or more storage elements, to process input data. The storage elements may also store data or other information as desired or needed. The storage element may be in the form of an information source or a physical memory element within a processing machine.

The set of instructions may include various commands that instruct the computer, module, system, or processor as a processing machine to perform specific operations such as the methods and processes of the various embodiments described and/or illustrated herein. The set of instructions may be in the form of a software program. The software may be in various forms such as system software or application software and which may be embodied as a tangible and non-transitory computer readable medium. Further, the software may be in the form of a collection of separate programs, systems, or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable and include any computer program stored in memory for execution by a computer, including RAM memory, ROM memory, EPROM memory, EEPROM memory, and non-volatile RAM (NVRAM) memory. The above memory types are exemplary only and are thus not limiting as to the types of memory usable for storage of a computer program. The individual components of the various embodiments may be virtualized and hosted by a cloud type computational environment, for example to allow for dynamic allocation of computational power, without requiring the user concerning the location, configuration, and/or specific hardware of the computer system.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from the scope thereof. Dimensions, types of materials, orientations of the various components, and the number and positions of the various components described herein are intended to define parameters of certain embodiments and are by no means limiting and are merely exemplary embodiments. Many other embodiments and modifications within the spirit and scope of the claims will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112, paragraph (f), unless and until such claim limitations expressly use the phrase "means for" followed by a statement of function void of further structure.

This written description uses examples to disclose the various embodiments, and to enable a person having ordinary skill in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A gate drive circuit device comprising:
    a positive pulse circuit portion including a first positive pulse diode and a positive pulse assembly connected in parallel with each other, the positive pulse assembly including a second positive pulse diode and a first resistor-capacitor assembly connected in series, the first resistor-capacitor assembly including a positive pulse resistor and a positive pulse capacitor connected in parallel with each other, wherein the positive pulse circuit portion also is configured to be conductively coupled with a first switch; and
    a negative pulse circuit portion including a first negative pulse diode and a negative pulse assembly connected in parallel with each other, the negative pulse assembly including a second negative pulse diode and a second resistor-capacitor assembly connected in series, the second resistor-capacitor assembly including a negative pulse resistor and a negative pulse capacitor connected in parallel with each other, wherein the negative pulse circuit portion also is configured to be conductively coupled with a second switch,
    wherein the positive pulse circuit portion is configured to activate the first switch responsive to receiving one or more positive voltage pulses from a power supply, and
    wherein the negative pulse circuit portion is configured to activate the second switch responsive to receiving one or more negative voltage pulses from the power supply.

2. The gate drive circuit device of claim 1, wherein the positive pulse circuit portion is configured to be conductively coupled with a conductive secondary winding of a transformer device from which the positive voltage pulse is inductively received.

3. The gate drive circuit device of claim 2, wherein the negative pulse circuit portion also is configured to be conductively coupled with the secondary winding of the transformer device from which the negative voltage pulse is inductively received.

4. The gate drive circuit device of claim 1, wherein the positive pulse circuit portion is configured to charge the positive pulse capacitor using the one or more positive voltage pulses and the negative pulse circuit portion is configured to charge the negative pulse capacitor using the one or more negative voltage pulses.

5. The gate drive circuit device of claim 4, wherein the positive pulse capacitor that is charged with the one or more positive voltage pulses is configured to apply a first voltage that is greater than a first turn-on threshold voltage to a gate of the first switch.

6. The gate drive circuit device of claim 4, wherein the negative pulse capacitor that is charged with the one or more negative voltage pulses is configured to apply a second voltage that is greater than a second turn-on threshold voltage to a gate of the second switch.

7. The gate drive circuit device of claim 1, wherein one or more of the positive circuit portion or the negative circuit portion is configured to receive one or more of a positive pulse train formed of a series of the positive voltage pulses or a negative pulse train formed of a series of the negative voltage pulses, wherein the positive pulse capacitor of the positive circuit portion is configured to be charged by the positive voltage pulses in the positive pulse train, the negative pulse capacitor of the negative circuit portion configured to be charged by the negative voltage pulses of the negative pulse train.

8. The gate drive circuit device of claim 1, wherein the positive and negative circuit portions are configured to concurrently receive a pulse train formed of a series of one or more of the positive voltage pulses and one or more of the negative voltage pulses, the positive pulse capacitor of the positive circuit portion configured to be charged by the one or more positive voltage pulses of the pulse train, the negative pulse capacitor of the negative circuit portion configured to be charged by the one or more negative voltage pulses of the pulse train.

9. The gate drive circuit device of claim 8, wherein the positive pulse capacitor that is charged and the negative pulse capacitor that is charged are configured to concurrently activate both the first and second switches.

10. The gate drive circuit device of claim 1, wherein the positive and negative circuit portions are configured to activate the first and second switches that are conductively coupled with a first output diode, a second auxiliary diode, an output capacitor, an auxiliary capacitor, an auxiliary inductance, a voltage source, and a load.

11. The gate drive circuit device of claim 10, wherein the positive circuit portion is configured to activate the first switch to direct voltage to the load from the voltage source through the first switch, through the second auxiliary diode to bypass the second switch, through the auxiliary inductance, and into the auxiliary capacitor for storage to decrease the voltage on the load.

12. The gate drive circuit device of claim 10, wherein the negative circuit portion is configured to activate the second switch to direct voltage from the voltage source through the second switch, through the first output diode to bypass the first switch, through the auxiliary inductance, and into the output capacitor to increase the voltage on the load.

13. The gate drive circuit device of claim 1, wherein the positive circuit portion is configured to conduct the positive voltage pulse to the positive capacitor to charge the positive capacitor and cause the positive capacitor to output a drive signal that is applied to a gate of the first switch to activate the first switch,
    wherein the drive signal created by the positive pulse capacitor activates the first switch for a longer time period than the positive voltage pulse.

14. The gate drive circuit device of claim 1, wherein the negative circuit portion is configured to conduct the negative voltage pulse to the negative capacitor to charge the negative capacitor and cause the negative capacitor to output a drive signal that is applied to a gate of the second switch to activate the second switch, wherein the drive signal created by the negative capacitor activates the second switch for a longer time period than the negative voltage pulse.

15. A switching system comprising:
two or more of the gate drive circuit devices of claim 1;
two or more sets of the first and second switches, wherein each of the sets of the first and second switches is coupled with a different gate drive circuit device of the gate drive circuit devices;
two or more sets of opposing diodes, wherein each of the sets of the opposing diodes is connected with a different set of the sets of the first and second switches;
auxiliary inductors each conductively coupled with different set of the opposing diodes;
auxiliary capacitors each conductively coupled with different set of the opposing diodes and the auxiliary inductors;
output capacitors each conductively coupled with different set of the opposing diodes; and
voltage sources each conductively coupled with different set of the opposing diodes and with a different output capacitor of the output capacitors, the voltage sources also configured to be coupled with a load.

16. The switching system of claim 15, wherein the gate drive circuit devices are coupled with secondary windings of a transformer device that are inductively coupled with a primary winding of the transformer device.

17. The switching system of claim 15, wherein the gate drive circuit devices are configured to individually control which of the voltage sources conducts voltage to power the load.

18. The switching system of claim 17, wherein each of the gate drive circuit devices is configured to activate the second switch to conduct the voltage from the corresponding voltage source to the corresponding output capacitor and the load.

19. The switching system of claim 17, wherein each of the gate drive circuit devices is configured to activate the first switch to conduct the voltage from the corresponding voltage source and the corresponding output capacitor to the corresponding auxiliary capacitor.

20. The switching system of claim 15, wherein the two or more gate drive circuit devices are configured to operate all of the first switches at the same time or all of the second switches at the same time.

21. The switching system of claim 15, wherein each of the voltage sources is referenced to a different reference voltage.

22. A switching system comprising:
two or more of the gate drive circuit devices of claim 1; and
a transformer device having a primary winding, at least one transformer core, and a secondary winding in each of the gate drive circuit devices,
wherein the transformer device is configured to concurrently transfer one or more of the positive voltage pulse and the negative voltage pulse to the secondary windings of all the gate drive circuit devices.

23. The switching system of claim 22, wherein the transformer device includes one or more transformer cores and one or more interconnection devices, each of the interconnection devices including plural additional primary windings conductively coupled with each other,
wherein each of the interconnection devices is configured to inductively couple two or more of the transformer cores with each other so that one or more of the positive voltage pulse or the negative voltage pulse is inductively transferred from the primary winding of the transformer device to the secondary windings of a first group of the gate drive circuit devices via a first core of the transformer cores, is inductively transferred from the primary winding of the transformer device to one of the additional primary windings of the interconnection device, is conducted to another one of the additional primary windings of the interconnection device, and is inductively transferred to the secondary windings of a second group of the gate drive circuit device via a separate, second core of the transformer cores.

* * * * *